(12) United States Patent
Lee et al.

(10) Patent No.: US 12,707,915 B2
(45) Date of Patent: Aug. 11, 2026

(54) APPARATUS FOR TREATING SUBSTRATE

(71) Applicant: SEMES CO., LTD., Cheonan-si (KR)

(72) Inventors: Jong Doo Lee, Cheonan-si (KR); Seung Hoon Oh, Cheonan-si (KR); Jin Mo Jae, Cheonan-si (KR); Ki Bong Kim, Paju-si (KR); Young Hun Lee, Cheonan-si (KR)

(73) Assignee: Semes Co., Ltd., Chungcheongnam-do (KR)

( * ) Notice: Subject to any disclaimer, the term of this patent is extended or adjusted under 35 U.S.C. 154(b) by 1010 days.

(21) Appl. No.: 17/874,933

(22) Filed: Jul. 27, 2022

(65) Prior Publication Data

US 2023/0035940 A1 Feb. 2, 2023

(30) Foreign Application Priority Data

Jul. 29, 2021 (KR) ........................ 10-2021-0099854

(51) Int. Cl.
*H10P 72/00* (2026.01)

(52) U.S. Cl.
CPC ................................ *H10P 72/0408* (2026.01)

(58) Field of Classification Search
None
See application file for complete search history.

(56) References Cited

U.S. PATENT DOCUMENTS

2019/0096717 A1 3/2019 Lee et al.

FOREIGN PATENT DOCUMENTS

| | | | |
|---|---|---|---|
| CN | 109560022 A | | 4/2019 |
| JP | 2013-033815 A | | 2/2013 |
| JP | 2018-207103 A | | 12/2018 |
| JP | 2019-067863 A | | 4/2019 |
| JP | 2020513157 A | * | 4/2020 |
| KR | 101628184 B1 | | 6/2016 |
| KR | 101910801 B1 | | 1/2019 |
| KR | 10-2019-0038330 A | | 4/2019 |
| KR | 102041308 B1 | | 11/2019 |
| KR | 2022-0097732 A | | 7/2022 |
| TW | 200307976 A | | 12/2003 |
| TW | 202107595 A | | 2/2021 |

OTHER PUBLICATIONS

Taiwanese Office Action dated Mar. 31, 2023 issued in corresponding Taiwanese Appln. No. 11220308530.
Korean Office Action dated Feb. 27, 2023 issued in corresponding Korean Appln. No. 10-2021-0099854.
Japanese Office Action dated Jul. 25, 2023 issued in corresponding Japanese Patent Application No. 2022-117282.

* cited by examiner

*Primary Examiner* — Jason Lau
(74) *Attorney, Agent, or Firm* — Harness, Dickey & Pierce, P.L.C.

(57) ABSTRACT

The inventive concept provides a substrate treating apparatus. The substrate treating apparatus includes a body; a fluid supply unit for supplying a treating fluid to a treating space within the body; and a fluid exhaust line for exhausting the treating fluid from the treating space, and wherein the body includes: a first body; a second body relatively moving with respect to the first body; and an anti-friction member for preventing a friction between the first body and the second body, and wherein the anti-friction member is configured continuously cover at least two surfaces among surfaces of the first body and the second body.

16 Claims, 19 Drawing Sheets

APPARATUS FOR TREATING SUBSTRATE

CROSS-REFERENCE TO RELATED APPLICATIONS

A claim for priority under 35 U.S.C. § 119 is made to Korean Patent Application No. 10-2021-0099854 filed on Jul. 29, 2021, in the Korean Intellectual Property Office, the entire contents of which are hereby incorporated by reference.

BACKGROUND

Embodiments of the inventive concept described herein relate to a substrate treating apparatus.

In order to manufacture a semiconductor device, a desired pattern is formed on a substrate such as a wafer through various processes on the substrate such as a photolithography process, an etching process, an ashing process, an ion implantation process, and thin film deposition process. Various treating liquids and treating gases are used for each process, and particles and process by-products are generated during the process. In order to remove these particles and process by-products from the substrate, a cleaning process is performed before and after each process.

A conventional cleaning process treats the substrate with a chemical and a rinsing liquid. Afterwards, a drying treatment is performed. An embodiment of the drying treatment includes a rotary drying process in which the substrate is rotated at a high speed to remove the rinsing liquid remaining on the substrate. However, there is a concern that this rotary drying method may collapse a pattern formed on the substrate.

Thus, recently a supercritical drying process is used for supplying an organic solvent such as an isopropyl alcohol (IPA) onto the substrate to replace a rinsing liquid remaining on the substrate with an organic solvent having a low surface tension, and then supplying a treating fluid (e.g., carbon dioxide) in a supercritical state onto the substrate to remove an organic solvent remaining on the substrate. In the supercritical drying process, the drying gas is supplied to a process chamber with a sealed inside, and the drying gas is heated and pressurized. Both a temperature and a pressure of the drying gas rise above a critical point, and the drying gas phase changes to the supercritical state.

In the substrate treating apparatus for performing a supercritical drying process, as shown in FIG. 1, a top body 1 and a bottom body 2 combine with each other to form an inner space, a substrate W such as a wafer is supported by a support member 4, and a drying gas is supplied to the inner space. In order for the drying gas to maintain a supercritical state, it is very important to maintain a pressure of the inner space at high pressure. The inner space is sealed by a sealing member 3 such as an O-ring. In addition, in order to minimize a generation of impurities such as particles in a region where the top body 1 and the bottom body 2 contact each other, a contact film 5 is installed on a bonding surface of the bottom body 2.

Meanwhile, while the substrate W is dried by the drying gas, a vibration is generated at the top body 1 and the bottom body 2 in various directions by the pressure of the inner space. Such a vibration occurs irregularly in various directions, such as a direction of an X-Y-Z direction, a direction rotating in an X-direction, a direction rotating in a Y-direction, a direction rotating in a Z-direction, and the like. In this case, as illustrated in FIG. 2, a deformation phenomenon and a push phenomenon may occur in the contact film 5.

SUMMARY

Embodiments of the inventive concept provide a substrate treating apparatus for efficiently treating a substrate.

Embodiments of the inventive concept provide a substrate treating apparatus for minimizing an occurrence of a push phenomenon or a deformation phenomenon in an anti-friction member provided between bodies.

Embodiments of the inventive concept provide a substrate treating apparatus for minimizing a fine vibration of a body during a high pressure process.

Embodiments of the inventive concept provide a substrate treating apparatus for increasing a replacement period of an anti-friction member.

The technical objectives of the inventive concept are not limited to the above-mentioned ones, and the other unmentioned technical objects will become apparent to those skilled in the art from the following description.

The inventive concept provides a substrate treating apparatus. The substrate treating apparatus includes a body; a fluid supply unit for supplying a treating fluid to a treating space within the body; and a fluid exhaust line for exhausting the treating fluid from the treating space, and wherein the body includes: a first body; a second body relatively moving with respect to the first body; and an anti-friction member for preventing a friction between the first body and the second body, and wherein the anti-friction member is configured continuously cover at least two surfaces among surfaces of the first body and the second body.

In an embodiment, the surfaces of the first body and the second body include: a first surface; and a second surface extending from the first surface, and wherein the anti-friction member includes: a first part configured to cover the first surface; and a second part which extends in a cross direction from a direction the first part extends and is configured to cover the second surface.

In an embodiment, the second part is provided in a plurality.

In an embodiment, some second parts extend from the first part in an upward direction, and the other second parts extend in a downward direction.

In an embodiment, some second parts extend from the first part in an upward and inclined direction, and the other second parts extend in a downward and inclined direction.

In an embodiment, the anti-friction member has a a form in which the first part and the second part are integrally formed.

In an embodiment, the second parts are spaced apart from each other, and a space is 15 mm to 20 mm.

In an embodiment, surfaces of the first body and the second body include a third surface extending from the first surface and the second surface, and the anti-friction member further includes a third part extending from the first part.

In an embodiment, the first body is a chamber body defining the treating space, and the second body is a clamping body for clamping the chamber body.

In an embodiment, each of the first body and the second body is a first chamber body and a second chamber body that combine with each other to define the treating space.

In an embodiment, any one of the first body or the second body is movable in a side direction.

In an embodiment, any one of the first body or the second body is movable in an up/down direction.

The inventive concept provides a substrate treating apparatus. The substrate treating apparatus includes a chamber body defining a treating space for treating a substrate, the chamber body including a first chamber body and a second chamber body relatively moving with respect to the first chamber body; a clamping body for clamping the first chamber body and the second chamber body, if the first chamber body and the second chamber body are in close contact in a close position; and an anti-friction member for preventing a friction between the clamping body and the chamber body.

In an embodiment, the anti-friction member is configured to continuously cover at least two surfaces among surfaces of any one of the clamping body or the chamber body.

In an embodiment, the anti-friction member is provided in a plurality and spaced apart from each other.

In an embodiment, some anti-friction members are arranged in a circumferential direction and spaced apart when seen from above.

In an embodiment, the surfaces of any one of the clamping body or the chamber body include: a first surface; a second surface extending from the first surface; and a third surface extending from the first surface and the second surface, and wherein the anti-friction member includes: a first part configured to cover the first surface; a second part which extends in a cross direction from a direction the first part extends and is configured to cover the second surface; and a third part extending from the first part.

In an embodiment, the anti-friction member is a polyimide film.

The inventive concept provides a substrate treating apparatus for treating a substrate by using a treating fluid in a supercritical state. The substrate treating apparatus includes a body; a fluid supply unit for supplying the treating fluid to a treating space within the body; and a fluid exhaust line for exhausting the treating fluid from the treating space, and wherein the body includes: a chamber body defining the treating space for treating the substrate, the chamber body including a first chamber body and a second chamber body relatively moving with respect to the first chamber body; a clamping body for clamping the first chamber body and the second chamber body, if the first chamber body and the second chamber body are in close contact in a close position; and an anti-friction member for preventing a friction between the clamping body and the chamber body, and wherein the anti-friction member is installed at the clamping body and is configured to continuously cover at least two surfaces among surfaces of the clamping body.

In an embodiment, the surfaces of the clamping body include: a first surface parallel to the ground; a second surface extending crosswise with respect to the first surface; and a third surface extending crosswise with respect to the first surface and the second surface, which is a surface in which the first clamping body and the second clamping body face each other, and wherein the anti-friction member includes: a first part configured to cover the first surface, a second part extending from the first part and configured to cover the second surface; and a third part extending from the first part and configured to cover the third surface.

The inventive concept provides a substrate treating apparatus for treating a substrate by using a treating fluid in a supercritical state. The substrate treating apparatus includes a first body; a second body combining with the first body to define a treating space for treating the substrate; and an anti-friction member installed on a bonding surface, which is a surface of the first body or the second body, at which the first body and the second body are bonded, and wherein the anti-friction member is provided in a plurality.

In an embodiment, anti-friction members are spaced apart from each other and installed at the bonding surface.

In an embodiment, the substrate treating apparatus further includes a moving unit for moving any one of the first body or the second body with respect to the other one of the first body and the second body, and a space between the anti-friction members is a space allowing any one of the anti-friction members to be spaced apart from another adjacent anti-friction member, if any one of the first body or the second body moves and is in a close position to define the treating space.

According to an embodiment of the inventive concept, a substrate may be efficiently treated.

According to an embodiment of the inventive concept, an occurrence of a push phenomenon or a deformation phenomenon in an anti-friction member provided between bodies may be minimized.

According to an embodiment of the inventive concept, an occurrence of a fine vibration of a body during a high pressure process may be minimized.

According to an embodiment of the inventive concept, a replacement period of an anti-friction member may be increased.

The effects of the inventive concept are not limited to the above-mentioned ones, and the other unmentioned effects will become apparent to those skilled in the art from the following description.

BRIEF DESCRIPTION OF THE FIGURES

The above and other objects and features will become apparent from the following description with reference to the following figures, wherein like reference numerals refer to like parts throughout the various figures unless otherwise specified, and wherein:

FIG. 4 schematically illustrates an embodiment of a liquid treating chamber of FIG. 3.

DETAILED DESCRIPTION

Figure 1:
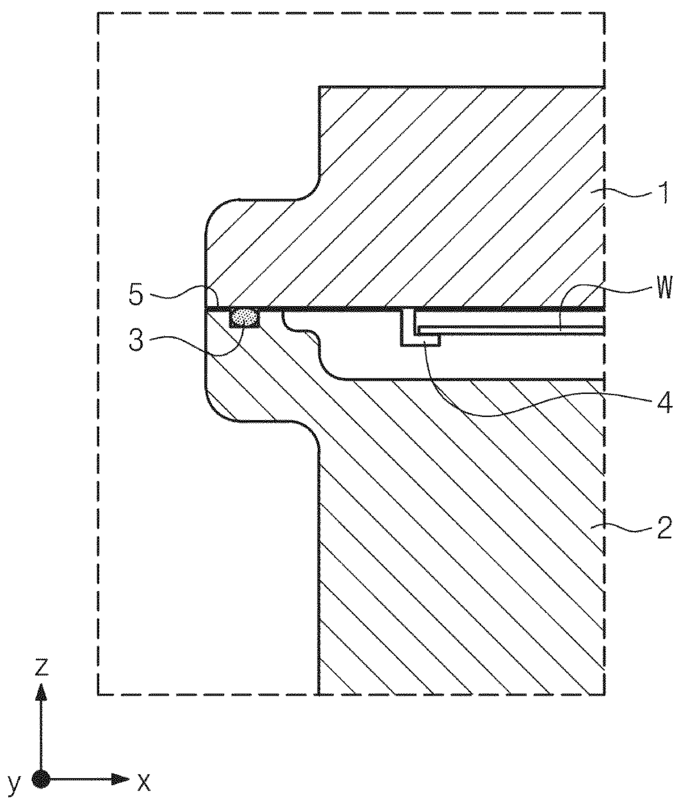
FIG. 1 illustrates a conventional substrate treating apparatus.
Figure 2:
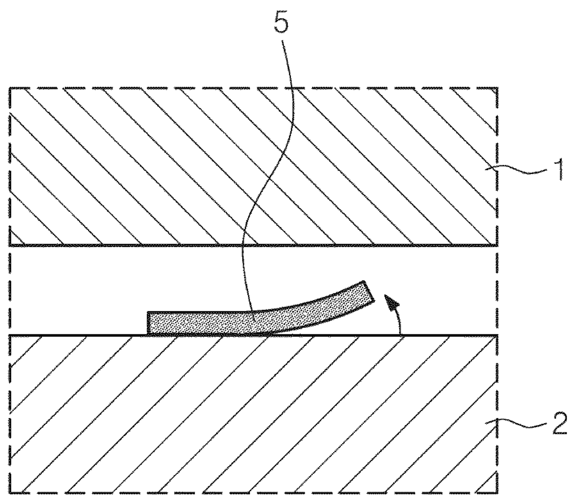
FIG. 2 illustrates a state in which a deformation phenomenon or a push phenomenon occurs on a contact film of FIG. 1.

The inventive concept may be variously modified and may have various forms, and specific embodiments thereof will be illustrated in the drawings and described in detail. However, the embodiments according to the concept of the inventive concept are not intended to limit the specific disclosed forms, and it should be understood that the present inventive concept includes all transforms, equivalents, and replacements included in the spirit and technical scope of the inventive concept. In a description of the inventive concept, a detailed description of related known technologies may be omitted when it may make the essence of the inventive concept unclear.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises", "comprising,", "includes", and/or "including" when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "example" is intended to refer to an example or illustration.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

It should be understood that when an element or layer is referred to as being "on," "connected to," "coupled to," or "covering" another element or layer, it may be directly on, connected to, coupled to, or covering the other element or layer or intervening elements or layers may be present. In contrast, when an element is referred to as being "directly on," "directly connected to," or "directly coupled to" another element or layer, there are no intervening elements or layers present. Other terms such as "between", "adjacent", "near" or the like should be interpreted in the same way.

Unless otherwise defined, all terms used herein, including technical or scientific terms, have the same meaning as those generally understood by those skilled in the art to which the inventive concept belongs. Terms such as those defined in commonly used dictionaries should be interpreted as consistent with the context of the relevant technology and not as ideal or excessively formal unless clearly defined in this application.

Hereinafter, an embodiment of the inventive concept will be described with reference to FIG. 3 to FIG. 22.

Figure 3:
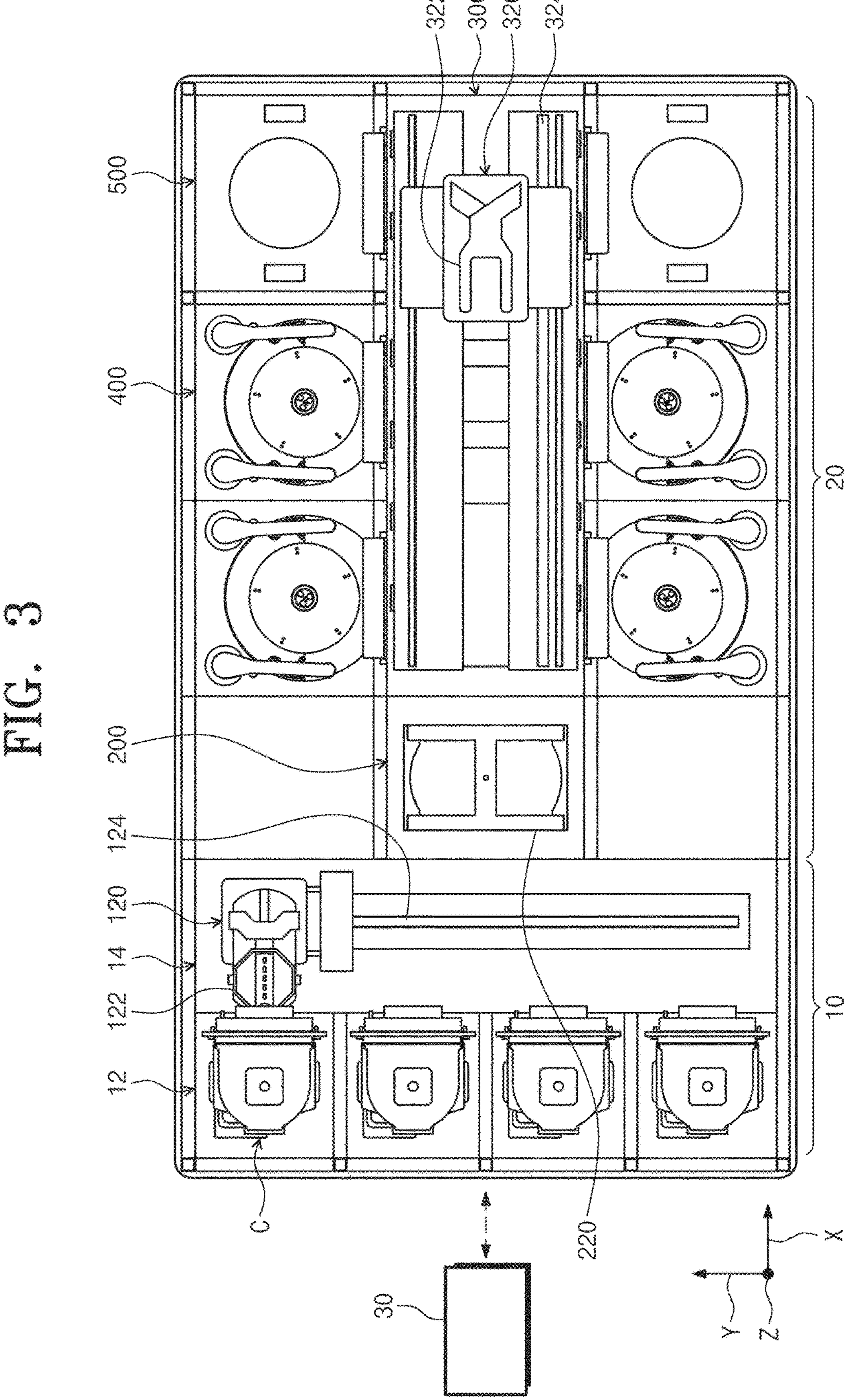
FIG. 3 illustrates a substrate treating apparatus according to an embodiment of the inventive concept.

FIG. 3 is a plan view illustrating a substrate treating apparatus according to an embodiment of the inventive concept.

Referring to FIG. 3, the substrate treating apparatus includes an index module 10, a treating module 20, and a controller 30. The index module 10 and the treating module 20 are disposed in a direction. Hereinafter, the direction in which the index module 10 and the treating module 20 are disposed will be referred to as a first direction X, a direction perpendicular to the first direction X will be referred to as a second direction Y, and a direction perpendicular to both the first direction X and the second direction Y will be referred to as a third direction Z.

The index module 10 transfers a substrate W from a container C in which the substrate W is stored to the treating module 20, and stores a substrate W to which a treating has been completed at the treating module 20 in the container C. A lengthwise direction of the index module 10 is provided in the second direction Y. The index module 10 has a load port 12 and an index frame 14. The index frame 14 is located between the load port 12 and the treating module 20. The container C in which the substrates W are stored is placed on the load port 12. A plurality of load ports 12 may be provided, and the plurality of load ports 12 may be disposed along the second direction Y.

For the container C, a sealed container such as a front open unified pod FOUP may be used. The container C may be placed on the load port 12 by a transfer means (not illustrated) such as an overhead transfer, an overhead conveyor, or an automatic guided vehicle or by an operator.

The index frame 14 is provided with an index robot 120. In the index frame 14, a guide rail 124 with its lengthwise direction in the second direction Y may be provided, and the index robot 120 may be provided to be movable along the guide rail 124. The index robot 120 may include a hand 122 on which the substrate W is placed, and the hand 122 may be forwardly and backwardly movable, rotatable around the third direction Z, and movable along the third direction Z. A plurality of hands 122 are provided to be spaced apart in an up/down direction, and the hands 122 may be forwardly and backwardly movable independently of each other.

The controller 30 may control the substrate treating apparatus. The controller may include a process controller e.g., a microprocessor (computer) that executes a control of the substrate treating apparatus, a user interface e.g., a keyboard in which an operator performs a command input operation or the like in order to manage the substrate treating apparatus, a display for visualizing and displaying an operation situation of the substrate treating apparatus, and the like, and a storage unit storing a control program for executing the process performed in the substrate treating apparatus under the control of the process controller, a various data and a program (i.e., treatment recipe) for executing various process in each component according to treating conditions. Further, the user interface and the storage unit may be connected to the process controller. The treatment recipe may be stored in a storage medium in the storage unit, and the storage medium may be a hard disk, and may also be a portable disk, such as a CD-ROM or a DVD, or a semiconductor memory, such as a flash memory.

The treating module 20 includes a buffer unit 200, a transfer chamber 300, a liquid treating chamber 400, and a drying chamber 500. The buffer unit 200 provides a space in which the substrate W carried into the treating module 20 and the substrate W carried out from the treating module 20 temporarily stay. The liquid treating chamber 400 supplies a liquid onto the substrate W to perform a liquid treatment process of liquid treating the substrate W. The drying chamber 500 performs a drying process of removing a liquid remaining on the substrate W. The transfer chamber 300 transfers the substrate W between the buffer unit 200, the liquid treating chamber 400, and the drying chamber 500.

A lengthwise direction of the transfer chamber 300 may be provided in the first direction X. The buffer unit 200 may be disposed between the index module 10 and the transfer chamber 300. The liquid treating chamber 400 and the drying chamber 500 may be disposed on a side of the transfer chamber 300. The liquid treating chamber 400 and the transfer chamber 300 may be disposed along the second direction Y. The drying chamber 500 and the transfer chamber 300 may be disposed along the second direction Y. The buffer unit 200 may be located at an end of the transfer chamber 300.

According to an embodiment, the liquid treating chambers 400 may be disposed on both sides of the transfer chamber 300, the drying chambers 500 may be disposed on both sides of the transfer chamber 300, and the liquid treating chambers 400 may be disposed closer to the buffer unit 200 than the drying chambers 500. In some embodiments, at one and/or both sides of the transfer chamber 300, the liquid treating chambers 400 may be provided in an array of A×B (A and B are natural numbers greater than 1 or 1) along the first direction X and the third direction Z. In some embodiments, at one and/or both sides of the transfer chamber 300, the drying chambers 500 may be provided in an array of C×D (C and D are natural numbers greater than 1 or 1) along the first direction X and the third direction Z. In some embodiments, only liquid treating chambers 400 may be provided at one side of the transfer chamber 300, and only dry chambers 500 may be provided at the other side of the transfer chamber 300.

The transfer chamber 300 has a transfer robot 320. In the transfer chamber 300, a guide rail 324 with its lengthwise direction provided in the first direction X may be provided, and the transfer robot 320 may be provided to be movable on the guide rail 324. The transfer robot 320 may include a hand 322 on which the substrate W is placed, and the hand 322 may be provided to be forwardly and backwardly movable, rotatable around the third direction Z as an axis, and movable along the third direction Z. A plurality of hands 322 are provided to be spaced apart in the up/down direction, and the hands 322 may be forwardly and backwardly movable independently from each other.

The buffer unit 200 includes a plurality of buffers 220 on which the substrate W is placed. The buffers 220 may be disposed to be spaced apart from each other in the third direction Z. A front face and a rear face of the buffer unit 200 are opened. The front face is a surface facing the index module 10, and the rear face is a surface facing the transfer chamber 300. The index robot 120 may access the buffer unit 200 through the front face, and the transfer robot 320 may access the buffer unit 200 through the rear face.

Figure 4:
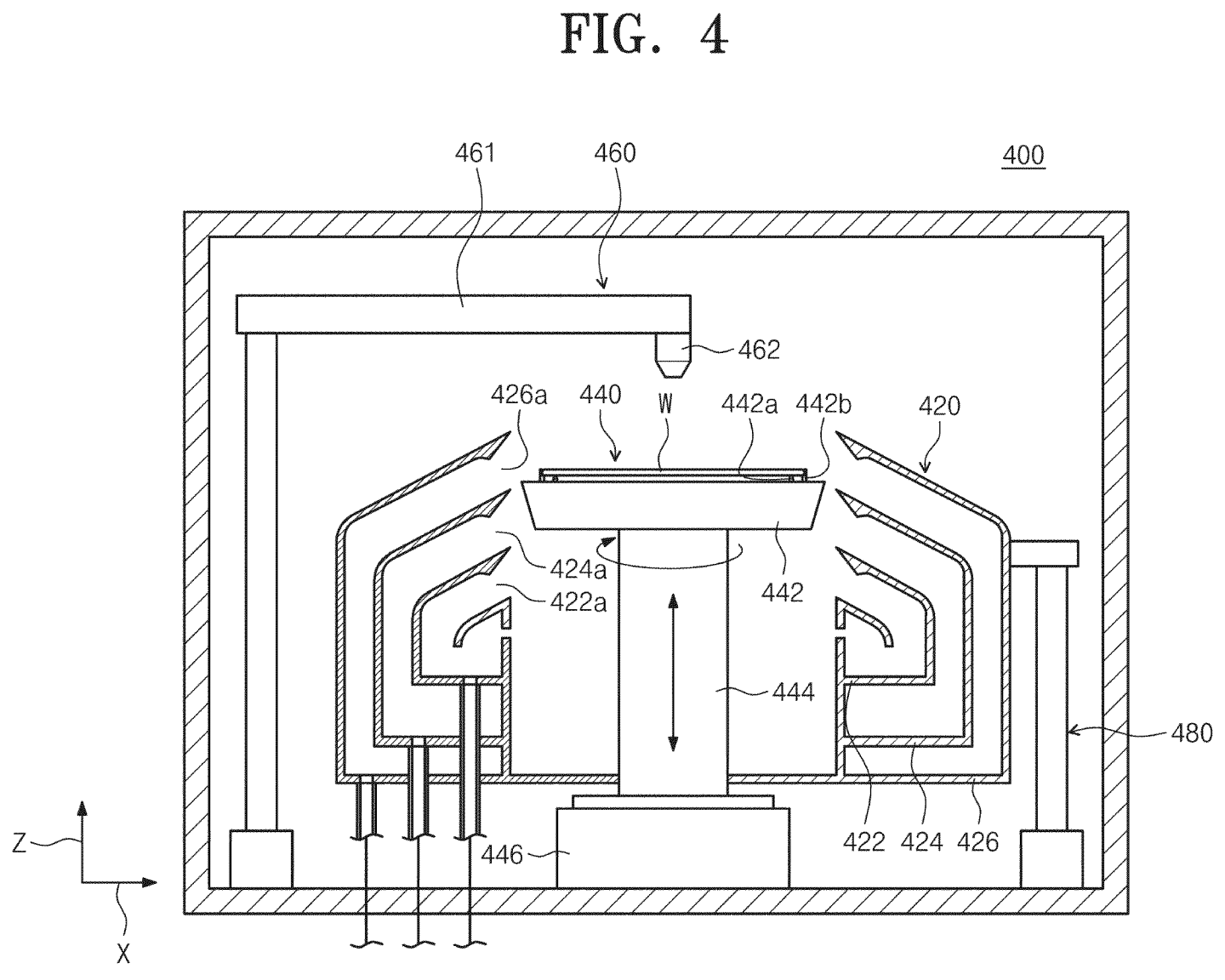

FIG. 4 schematically illustrates an embodiment of the liquid treating chamber of FIG. 3. Referring to FIG. 4, the liquid treating chamber 400 includes a housing 410, a cup 420, a support unit 440, a liquid supply unit 460, and a lifting/lowering unit 480.

The housing 410 may have an inner space in which the substrate W is treated. The housing 410 may have a generally hexahedral shape. For example, the housing 410 may have a rectangular parallelepiped shape. In addition, an opening (not shown) through which the substrate W is taken in or taken out may be formed in the housing 410. In addition, a door (not shown) for selectively opening and closing the opening may be installed at the housing 410.

The cup 420 may have a container shape with an open top. The cup 420 may have a treating space, and the substrate W may be liquid-treated in the treating space. The support unit 440 supports the substrate W in the treating space. The liquid supply unit 460 supplies the treating liquid onto the substrate W supported by the support unit 440. The treating liquid may be provided in a plurality of types and may be sequentially supplied onto the substrate W. The lifting/lowering unit 480 adjusts a relative height between the cup 420 and the support unit 440.

In an embodiment, the cup 420 has a plurality of recollecting containers 422, 424, and 426. Each of the recollecting containers 422, 424, and 426 has a recollecting space for recollecting the liquid used for substrate treatment. Each of the recollecting containers 422, 424, and 426 is provided in a ring shape surrounding the support unit 440. During a liquid treatment process, the treating liquid scattered by a rotation of the substrate W is introduced into the recollecting space through the inlets 422*a*, 424*a*, and 426*a* of each respective recollecting container 422, 424, and 426. According to an embodiment, the cup 420 has a first recollecting container 422, a second recollecting container 424, and a third recollecting container 426. The first recollecting container 422 is disposed to surround the support unit 440, the second recollecting container 424 is disposed to surround the first recollecting container 422, and the third recollecting container 426 is disposed to surround the second recollecting container 424. The second inlet 424*a* introducing the liquid into the second recollecting container 424 may be located above the first inlet 422*a* introducing the liquid into the first recollecting container 422, and the third inlet 426*a* introducing the liquid into the third recollecting container 424*a* may be located above the second inlet 424*a*.

The support unit 440 has a support plate 442 and a drive shaft 444. A top surface of the support plate 442 is provided in a substantially circular shape and may have a diameter larger than that of the substrate W. A support pin 442*a* is provided at a central part of the support plate 442 to support a bottom surface of the substrate W, and the support pin 442*a* is provided to protrude from the support plate 442 such that the substrate W is spaced apart from the support plate 442 by a predetermined distance. A chuck pin 442*b* is provided at an edge of the support plate 442. The chuck pin 442*b* is provided to upwardly protrude from the support plate 442, and supports a side of the substrate W so that the substrate W is stably held by the support unit 440 when the substrate W is rotated. The drive shaft 444 is driven by the driver 446, is connected to the center of the bottom surface of the substrate W, and rotates the support plate 442 based on its central axis.

According to an embodiment, the liquid supply unit 460 may include a nozzle 462. The nozzle 462 may supply the treating liquid to the substrate W. The treating liquid may be a chemical, a rinsing liquid, or an organic solvent. The chemical may be a chemical with strong acid properties or strong base properties. In addition, the rinsing liquid may be a deionized water. In addition, the organic solvent may be an isopropyl alcohol (IPA). In addition, the liquid supply unit 460 may include a plurality of nozzles 462, and each nozzle 462 may supply a different type of treating liquid. For example, one of the nozzles 462 may supply a chemical, another one of the nozzles 462 may supply the rinsing liquid, and still another one of the nozzles 462 may supply an organic solvent. In addition, the controller 30 may control the liquid supply unit 460 to supply the organic solvent from the still another one of the nozzles 462 to the substrate W after supplying the rinsing liquid to the substrate W from the another one of the nozzles 462. Accordingly, the rinsing liquid supplied onto the substrate W may be substituted with an organic solvent having a small surface tension.

The lifting/lowering unit 480 moves the cup 420 in the up/down direction. A relative height between the cup 420 and the substrate W is changed by an up/down movement of the cup 420. As a result, the recollecting containers 422, 424, 426 for recollecting the treating liquid are changed in accordance with a type of liquid supplied to the substrate W, so that the liquids can be recollected separately. Unlike the above description, the cup 420 is fixedly installed, and the lifting/lowering unit 480 may move the support unit 440 in the up/down direction.

Figure 5:
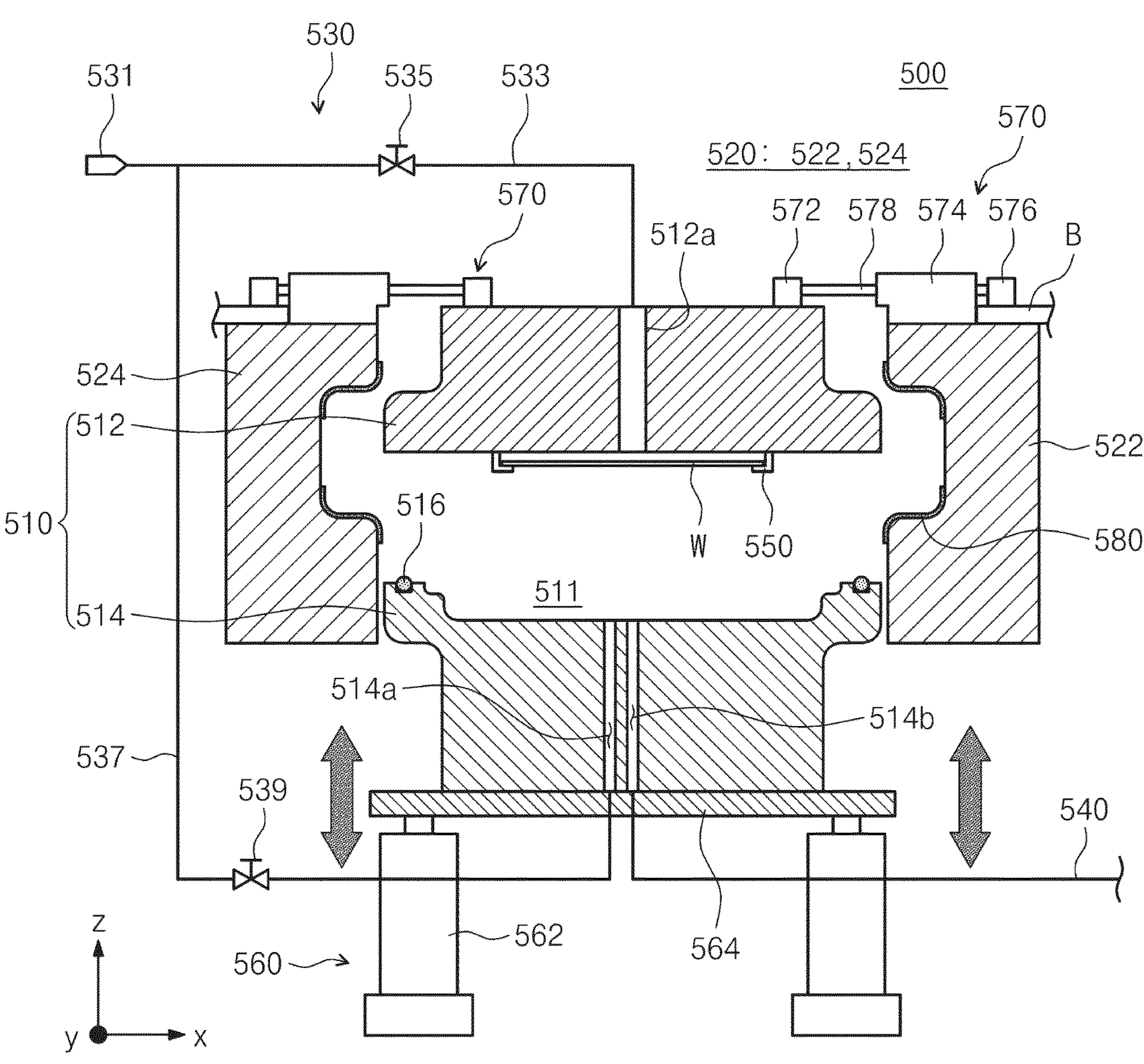
FIG. 5 schematically illustrates an embodiment of a drying chamber of FIG. 3.

FIG. 5 schematically illustrates an embodiment of the drying chamber of FIG. 3.

Referring to FIG. 5, the drying chamber 500 according to an embodiment of the inventive concept may remove the treating liquid remaining on the substrate W by using the drying fluid in a supercritical state. For example, the drying chamber 500 may perform a drying process of removing an organic solvent remaining on the substrate W using the carbon dioxide $CO_2$ in a supercritical state.

The drying chamber 500 may include a chamber body 510 (an exemplary first body), a clamping body 520 (an exemplary second body), a fluid supply unit 530, a fluid exhaust line 540, a support member 550, a first moving unit 560, a second moving unit 570, and an anti-friction member 580. The chamber body 510 and the clamping body 520 may be collectively referred to as a body.

The chamber body 510 may include a top body 512 (another exemplary first body), and a bottom body 514 (another exemplary second body). The top body 512 and the bottom body 514 may be combined with each other to form a treating space 511. Any one of the top body 512 and the bottom body 514 may be configured to be relatively movable with respect to the other. For example, any one of the top body 512 and the bottom body 514 may be moved by a first moving unit 560. The first moving unit 560 may include a lifting/lowering driver 562 and a lifting/lowering plate 564. A plurality of lifting/lowering drivers 562 may be provided and connected to the lifting/lowering plate 564. The lifting/lowering plate 564 may be coupled to the bottom body 514. When the lifting/lowering driver 562 lifts and lowers the lifting/lowering plate 564, the bottom body 514 may also be lifted and lowered together with the lifting/lowering plate 564. A heater for heating a drying fluid supplied to the treating space 511 may be buried in the chamber body 510. In addition, when the top body 512 and the bottom body 514 are at a close position, a groove may be formed at the bottom body 514 to increase an airtightness of the inner space 511, and an O-ring 516 which is a sealing member may be inserted into the groove.

A position of the top body 512 may be fixed, and the bottom body 514 may be lifted and lowered in a third direction Z by the first moving unit 560. Hereinafter, a position where the bottom body 514 rises and contacts the top body 512 to form the treating space 511 is referred to as a close position, and a position where the bottom body 514 descends and is spaced apart from the top body 512 is referred to as an open position.

The clamping body 520 may include a first clamping body 522 and a second clamping body 524. The first clamping body 522 and the second clamping body 524 may clamp the chamber body 510 at opposite positions. An inner surface of the first clamping body 522 and the second clamping body 524 can have a shape substantially corresponding to an outer surface of the chamber body 510 in the close position. The first clamping body 522 and the second clamping body 524 may be moved by the second moving unit 570. A plurality of second moving units 570 may be provided. Any one of the second moving unit 570 may be connected to the top body 512 and the first clamping body 522, and the other of the second moving unit 570 may be connected to the top body 512 and the second clamping body 524.

The second moving unit 570 may include a first body 572 coupled to the top body 522, a second body 574 coupled to the clamping body 520 and moving along a moving rail 578, and a third body 576 coupled to a fixed outer wall B. The second body 574 may move the clamping body 520 in a direction toward the chamber body 510 while moving in the first direction X.

The fluid supply unit 530 may supply a drying fluid to the treating space 511. The drying fluid supplied by the fluid supply unit 530 may include a carbon dioxide $CO_2$. The fluid supply unit 530 may include a fluid supply source 531, a first supply line 533, a first supply valve 535, a second supply line 537, and a second supply valve 539.

The fluid supply source 531 may store and/or supply the drying fluid supplied to the treating space 511. The fluid supply source 531 may supply the drying fluid to the first supply line 533 and/or the second supply line 537. For example, a first supply valve 535 may be installed at the first supply line 533. In addition, the first supply line 533 may be connected to the first supply channel **512*a* formed at the top body 512. In addition, a second supply valve 539 may be installed at the second supply line 537. In addition, the second supply line 537 may be connected to the second supply channel 514*a* formed at the bottom body 514. The first supply valve 535 and the second supply valve 539 may be on/off valves. Depending on the on/off of the first supply valve 535 and the second supply valve 539, the drying fluid may selectively flow in the first supply line 533 or the second supply line 537**.

In the above-described example, the first supply line 533 and the second supply line 537 are connected to one fluid supply source 531, but are not limited thereto. For example, a plurality of fluid supply sources 531 may be provided, the first supply line 533 may be connected to any one of a plurality of fluid supply sources 531, and the second supply line 537 may be connected to the other of the fluid supply sources 531.

In addition, the first supply line 533 may be a top supply line that supplies a drying gas from above the treating space 511. For example, the first supply line 533 may supply the drying gas to the treating space 511 in a direction from a top to a bottom. In addition, the second supply line 537 may be a bottom supply line that supplies the drying gas from below the treating space 511. For example, the second supply line 537 may supply drying gas to the treating space 511 in a direction from the bottom to the top.

The fluid exhaust line 540 may exhaust the drying fluid from the treating space 511. The fluid exhaust line 540 may be connected to a depressurizing member (not shown) that provides a depressurization to the treating space. In addition, the fluid exhaust line 540 may be connected to an exhaust channel **514*b* formed at the bottom body 514**. The depressurizing member may be a pump. However, the inventive concept is not limited thereto, and the depressurizing member may be variously modified into a known device capable of providing a depressurization to the treating space.

The support member 550 may support a substrate W at the treating space 511. The support member 550 may support an edge region of the substrate W in the treating space 511. The support member 550 may support a bottom surface of the edge region of the substrate W. The support member 550 may be installed at the top body 512.

The anti-friction member 580 may be installed at the clamping body 520. The anti-friction member 580 may be installed on an inner surface of the clamping body 520. The anti-friction member 580 may be installed in an area where the clamping body 520 and the chamber body 510 may contact each other, that is, a bonding surface. The anti-friction member 580 may be referred to as an anti-friction film. A plurality of anti-friction members 580 may be provided. Some of the anti-friction members 580 may be installed at a bottom part of an inner surface of the clamping body 520, and other anti-friction members 580 may be installed at a top part of the inner surface of the clamping body 520.

The anti-friction member 580 may be installed at each of the first clamping body 522 and the second clamping body 524. Two anti-friction members 580 may be installed at a bottom part of an inner surface of the first clamping body 522 and two anti-friction members 580 may be installed at a top part of the inner surface of the first clamping body 522. Similarly, two anti-friction members 580 may be installed at a bottom part of an inner surface of the second clamping body 522 and two anti-friction members 580 may be installed at a top part of the inner surface of the second clamping body 522. That is, the anti-friction member 580 may be installed at eight points. An installation position and a specific shape of the anti-friction member 580 will be described later.

Figure 6:
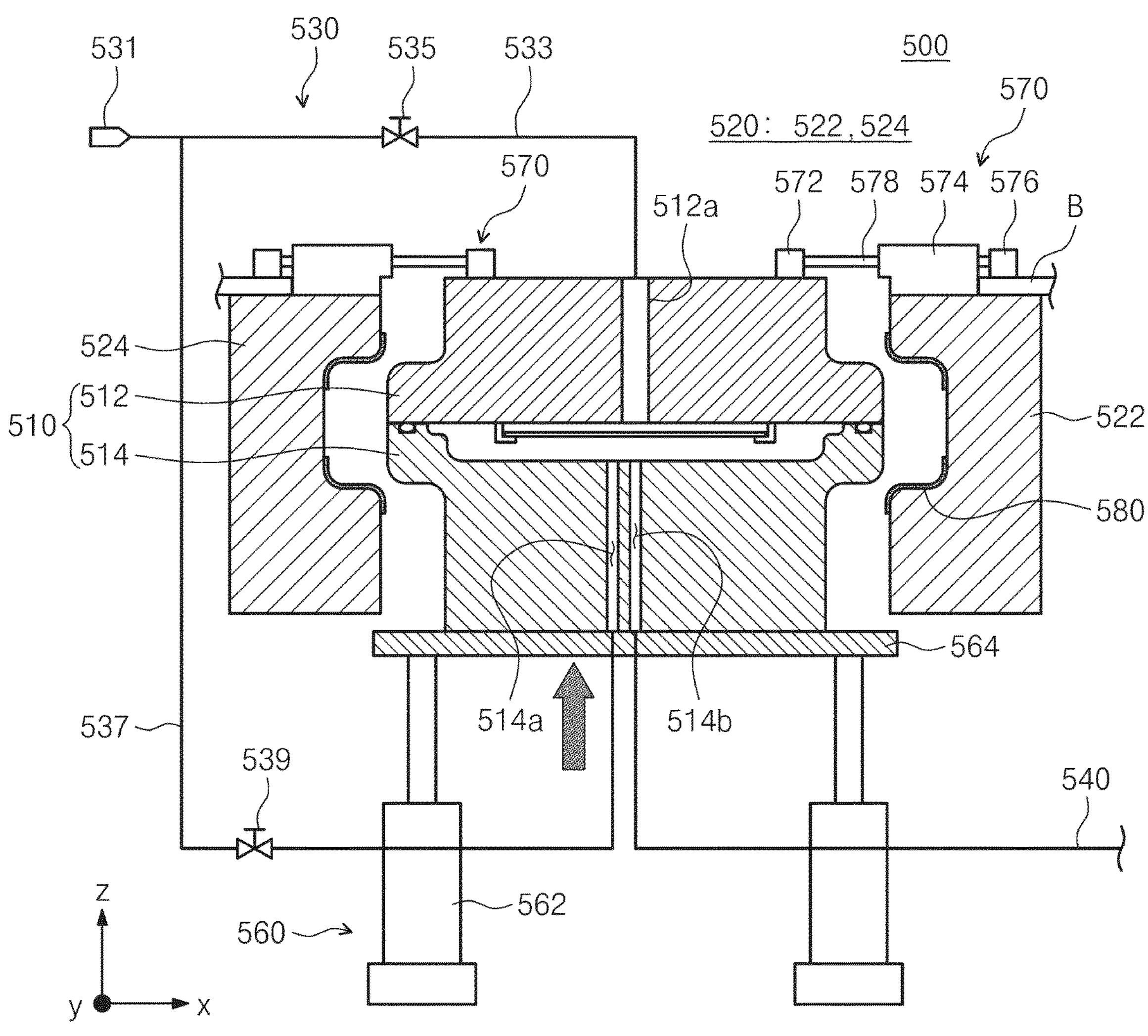
FIG. 6 illustrates a state in which a top body and a bottom body of FIG. 5 are positioned in a close position.
Figure 7:
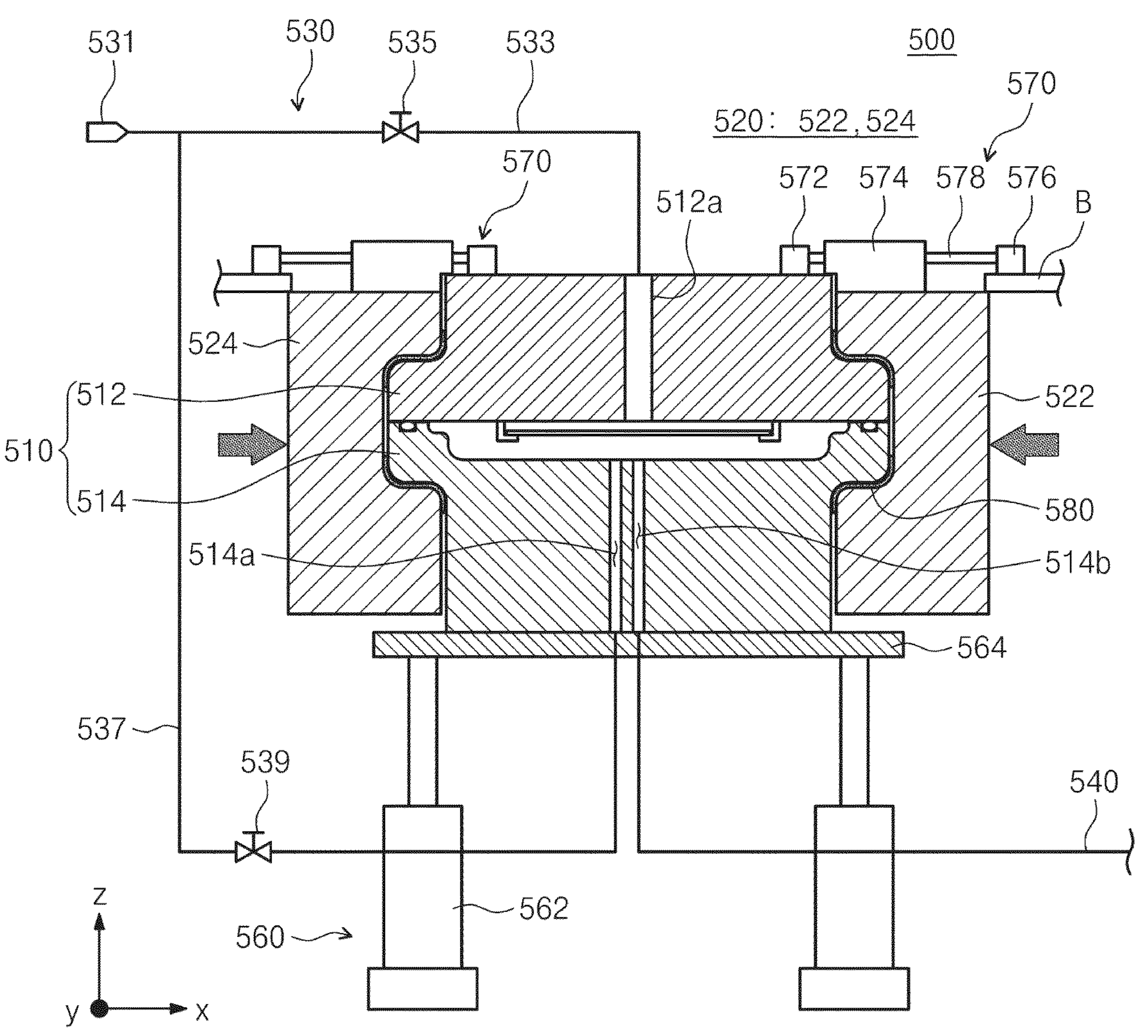
FIG. 7 illustrates a state in which a first clamping body and a second clamping body of FIG. 5 are positioned in a clamping position.

FIG. 6 illustrates a state in which a top body and a bottom body of FIG. 5 are positioned at a close position, and FIG. 7 illustrates a state in which a first clamping body and a second clamping body of FIG. 5 are positioned at a clamping position.

Referring to FIG. 6 and FIG. 7, when a drying process of a substrate W begins, for example, a high-pressure drying process of drying the substrate W using a supercritical drying fluid, a first moving unit 560 may move any one of the top body 512 and the bottom body 514 from an open position spaced apart from the other to a close position (see FIG. 6). Thereafter, to restrict a movement of the top body 512 and the bottom body 514 during the high-pressure drying process, the first clamping body 522 and the second clamping body 524 may move from a release position that releases a movement restriction of the top body 512 and the bottom body 514 (see FIG. 7) to a clamping position that restricts a movement of the top body 512 and the bottom body 514.

Figure 8A:
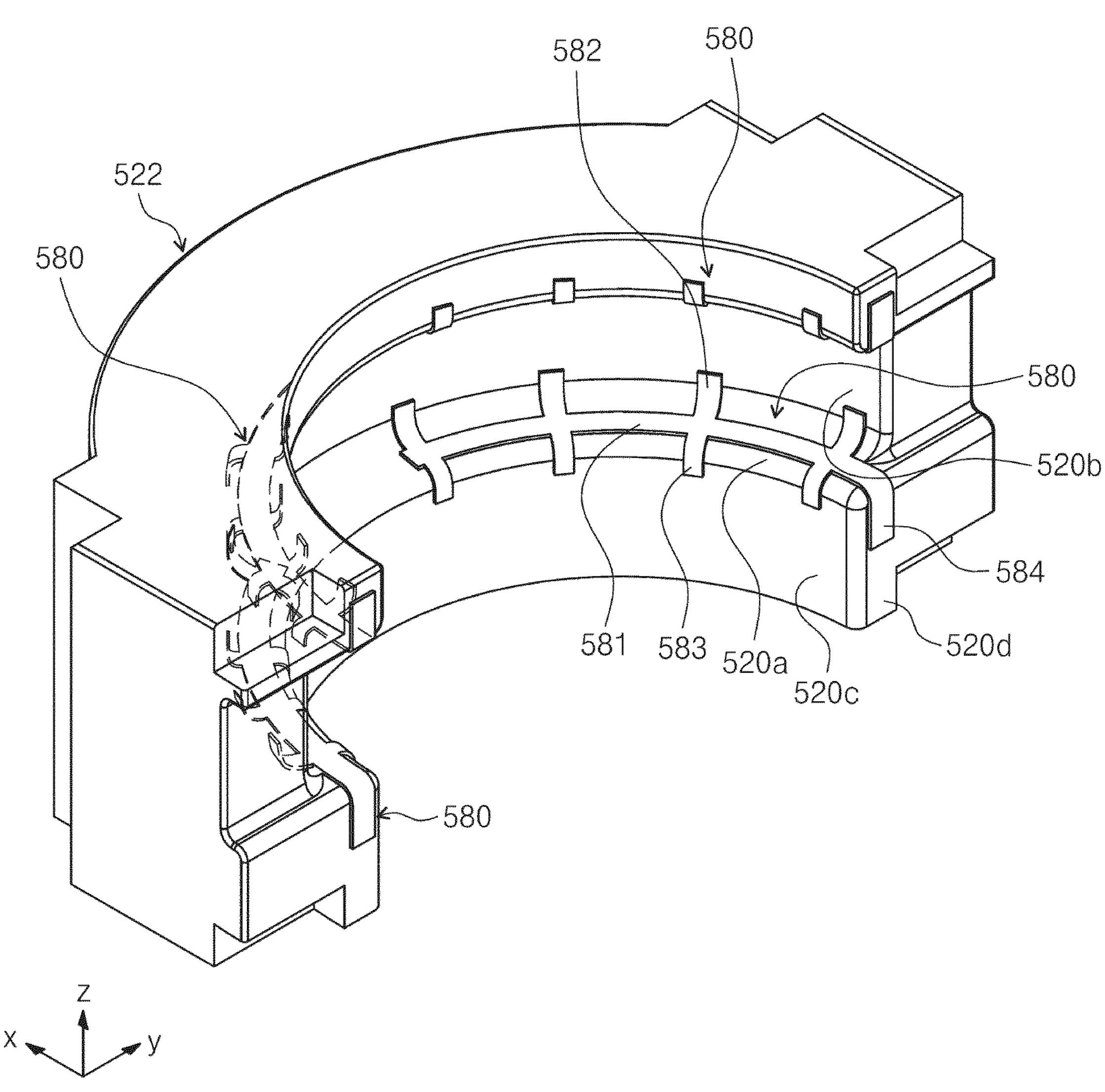
FIG. 8A is a perspective view illustrating any one of the clamping bodies of FIG. 5.
Figure 8B:
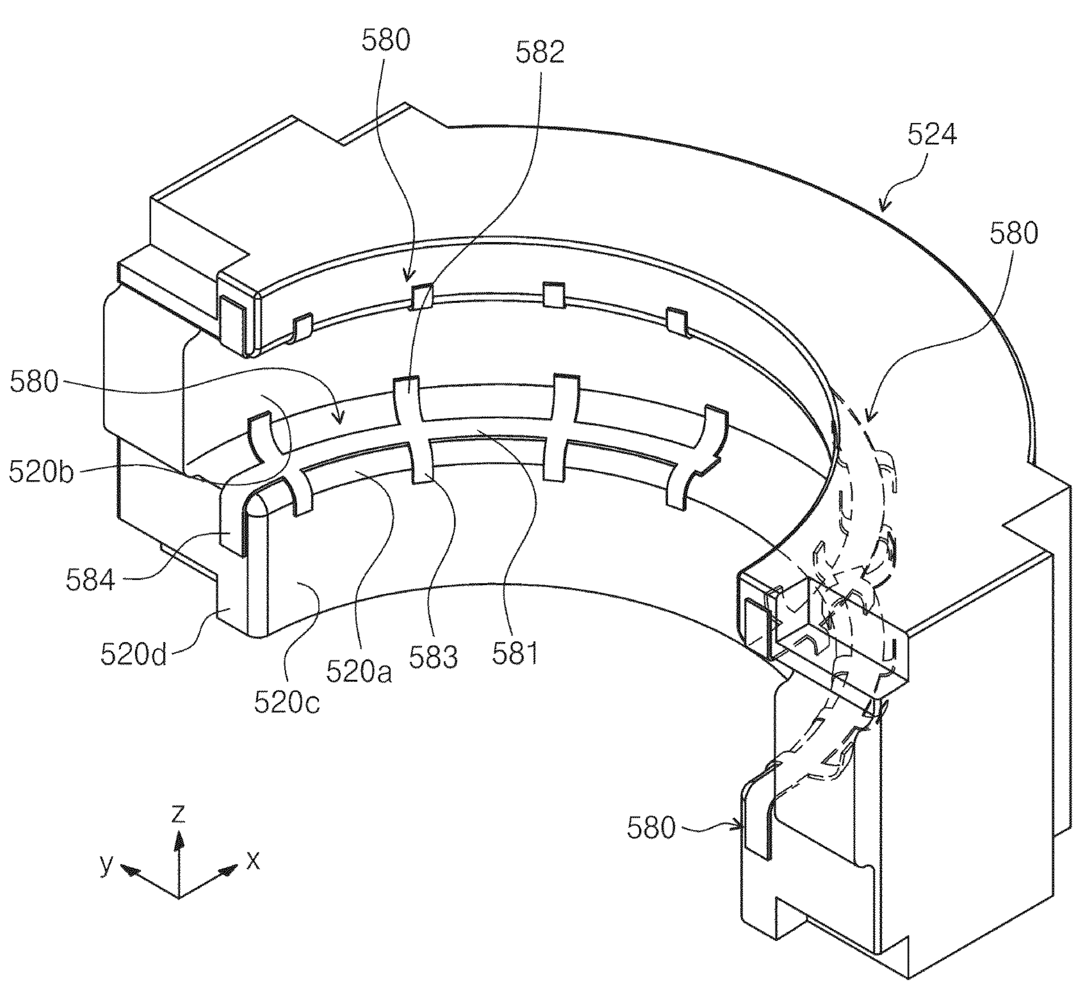
FIG. 8B is a perspective view illustrating another one of the clamping bodies of FIG. 5.
Figure 9:
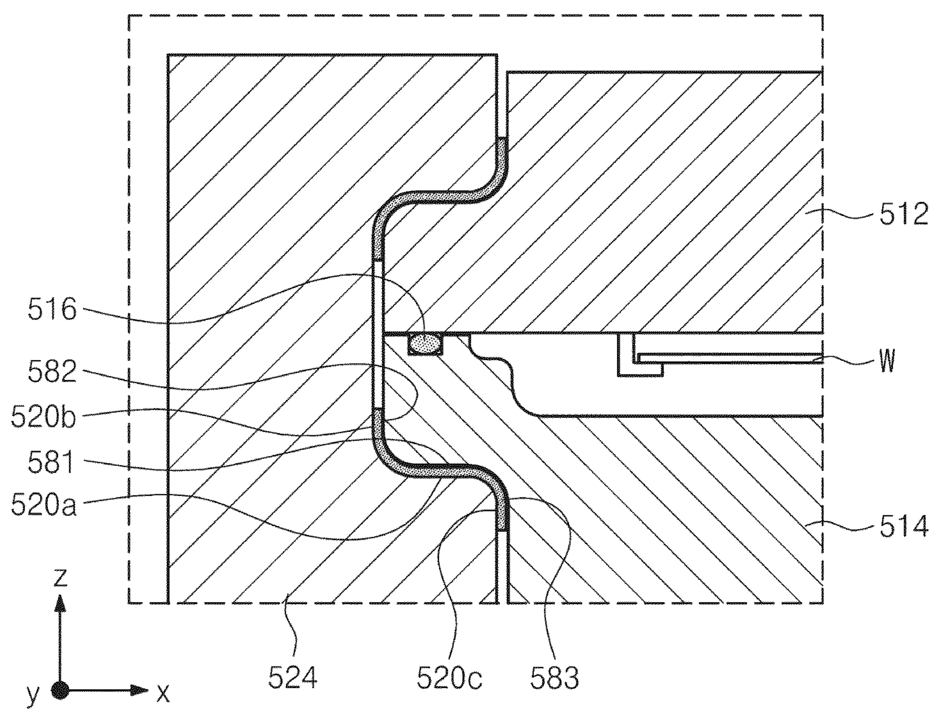
FIG. 9 is an enlarged view illustrating a part of a chamber body and a clamping body of FIG. 5.

FIG. 8A is a perspective view illustrating any one of the clamping bodies of FIG. 5, FIG. 8B is a perspective view illustrating the other clamping bodies of FIG. 5, and FIG. 9 is an enlarged view of a part of a chamber body and a clamping body of FIG. 5.

Referring to FIG. 8A, FIG. 8B, and FIG. 9, when a top body 512 and a bottom body 514 are in a close position to closely contact each other, an outer surface of the chamber body 520 may have a form corresponding to an inner surface of the clamping body 520. For example, when the top body 512 and the bottom body 514 are in the close position, a part of the outer surface of the chamber body 520 may be clamped by the inner surface of the first clamping body 522, and the other part of the outer surface of the chamber body 520 may be clamped by the inner surface of the second clamping body 524.

An anti-friction member 580 may be installed on the inner surface of the first clamping body 522. The anti-friction member 580 may be installed on the inner surface of the second clamping body 524. The anti-friction members 580 may be attached to the inner surfaces of the first clamping body 522 and the second clamping body 524 by an adhesive or the like. However, this invention is not limited to it, and the anti-friction members 580 can be coupled and installed on the inner surface of the clamping body 520 by a coupling means such as a bolt/screw.

A plurality of anti-friction members 580 may be installed at the inner surface of the first clamping body 522. The anti-friction members 580 installed on the inner surface of the first clamping body 522 may be installed to be spaced apart from each other. When the first clamping body 522 is at the clamping position, the anti-friction members 580 may be pressurized, and a space between the anti-friction members 580 may be disposed at an interval that does not overlap each other even when the anti-friction members 580 are pressurized. In addition, a plurality of anti-friction members 580 (for example, two anti-friction members 580) may be installed at a bottom part of the inner surface of the first clamping body 522 to be spaced apart from each other. In addition, the plurality of anti-friction members 580 (for example, two anti-friction members 850) may be installed at a top part of the inner surface of the first clamping body 522 to be spaced apart from each other. The anti-friction members 580 may be installed to be spaced apart from each other in a circumferential direction when viewed from above. For example, the two anti-friction members 580 disposed on the top part of the inner surface of the first clamping body 522 may be installed to be spaced apart from each other along the circumferential direction when viewed from above. In addition, the two anti-friction members 580 disposed at a bottom part of the inner surface of the first clamping body 522 may be spaced apart from each other along the circumferential direction when viewed from above. An arrangement of the anti-friction members 580 installed at the second clamping body 524 is symmetrical to an arrangement of the anti-friction members 580 installed at the first clamping body 522, and thus a repeated description thereof will be omitted.

In addition, inner surfaces of the first clamping body 522 and the second clamping body 524 may each include a first surface 520*a*, second surfaces 520*b* and 520*c*, and a third surface 520*d*, respectively. The first surface 520*a* may be a surface parallel to the ground. The second surfaces 520*b* and 520*c* may be surfaces extending from the first surface 520*a*. The second surfaces 520*b* and 520*c* may be surfaces extending in a direction crossing a direction in which the first surface 520*a* extends. For example, the second surfaces 520*b* and 520*c* may be surfaces extending in a direction perpendicular to a direction in which the first surface 520*a* extends. The third surface 520*d* may be a surface extending from the first surface 520*a* and the second surface 520*c*. The third surface 520*d* may be a surface extending in a direction perpendicular to a direction in which the first surface 520*a* extends, and in a direction perpendicular to a direction in which the second surface 520*c* extends.

The anti-friction member 580 may be configured to continuously cover at least two surfaces of the inner surfaces of the clamping body 520. For example, the anti-friction member 580 may include a first part 581, a second part 582 and 583, and a third part 584. The first part 581 may be configured to cover the first surface 520*a* of the clamping body 520. The first part 581 may have an arc shape when viewed from above.

The second parts 582 and 583 may extend from the first part 581. The second parts 582 and 583 may cross and extend in a direction in which the first part 581 extends. For example, the second parts 582 and 583 may extend in a direction perpendicular to a direction in which the first part 581 extends. The second parts 582 and 583 may be configured to cover the second surfaces 520*b* and 520*c*. A part of the second parts 582 and 583 may upwardly extend, and the other part of the second parts 582 and 583 may downwardly extend. In addition, a plurality of second parts 582 and 583 may be provided, and the second parts 582 and 583 may be provided to be spaced apart from each other. The interval between the second parts 582 and 583 may be about 15 mm to about 20 mm. In addition, the anti-friction member 580 may further include a third part 584 configured to cover the third surface 520*d*. The third part 584 may extend from the first part 581.

In addition, the first part 581, the second parts 582, 583, and the third part 584 of the anti-friction member 580 may be integrally provided. That is, the anti-friction member 580 may have a shape in which several films are integrally processed such that the first part 581, the second part 582, and the third part 584 have one body, rather than each being attached to the inner surface of the clamping body 520. This is because when several films overlap to form the anti-friction member 580 to have the first part 581, the second parts 582 and 583, and the third part 584, the anti-friction member 580 is highly likely to be damaged by a vibration generated by a pressure of the treating space 511.

The anti-friction member 580 of the present application is provided as a three-dimensional film structure rather than simply a form attached to a plane. In addition, the anti-friction member 580 is installed to withstand vertical, horizontal, and front-back forces transferred by the chamber body 510.

Figure 10:
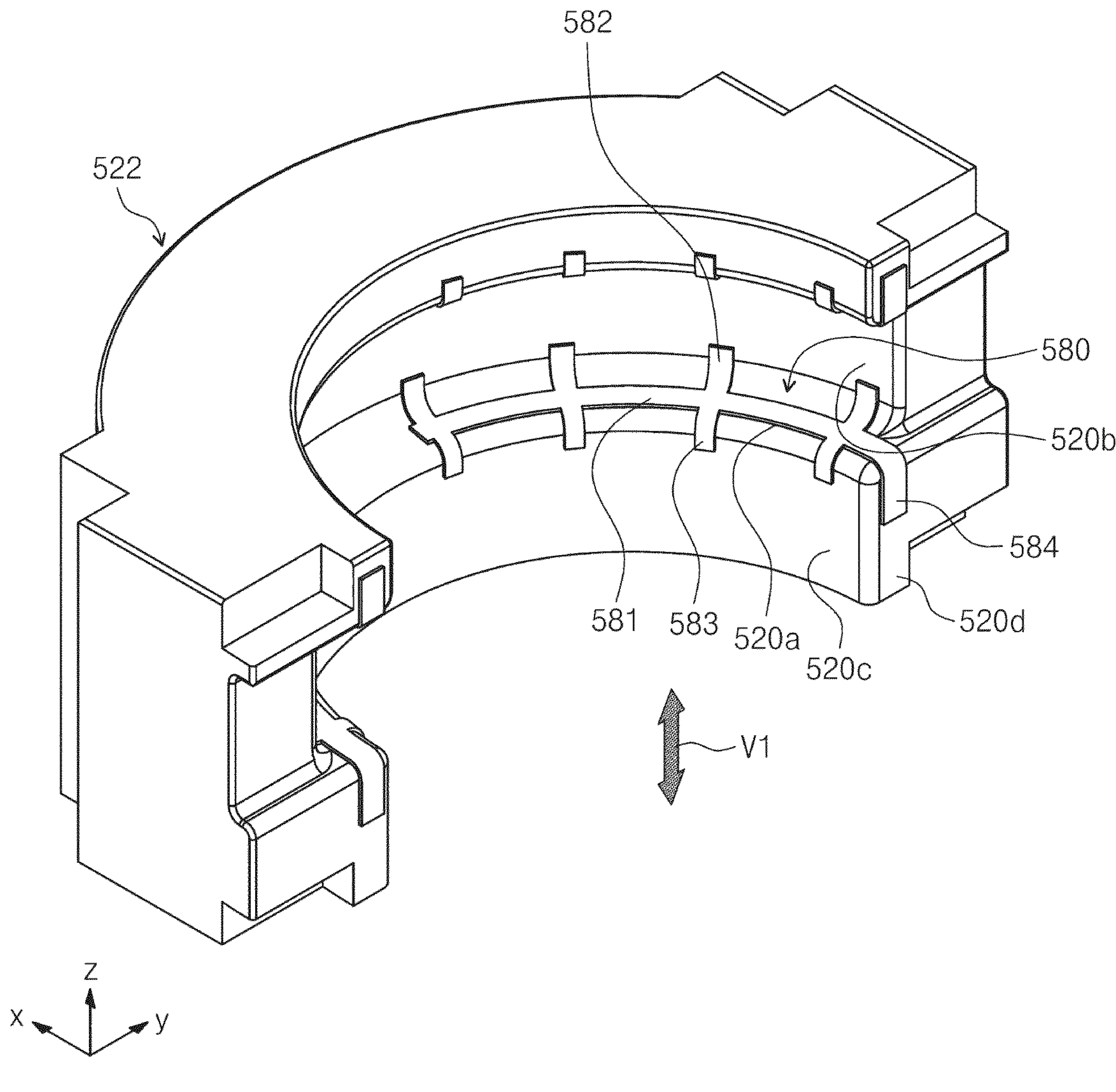
FIG. 10, FIG. 11, and FIG. 12 illustrate vibrations of the chamber body that may be transmitted to the clamping body.

Specifically, as illustrated in FIG. 10, a chamber body 510 may transfer a vibration V1 that shakes in an up-down direction, for example, a third direction Z, to the clamping body 520. In this case, even if the vibration V1 shaking in the third direction Z is transferred to the clamping body 520, a force received by the first part 581 of the anti-friction member 580 is transferred in a direction toward the first surface 520*a* of the clamping body 520, and thus a deformation phenomenon or a pushing phenomenon nearly does not occur at the friction member 580.

Figure 11:
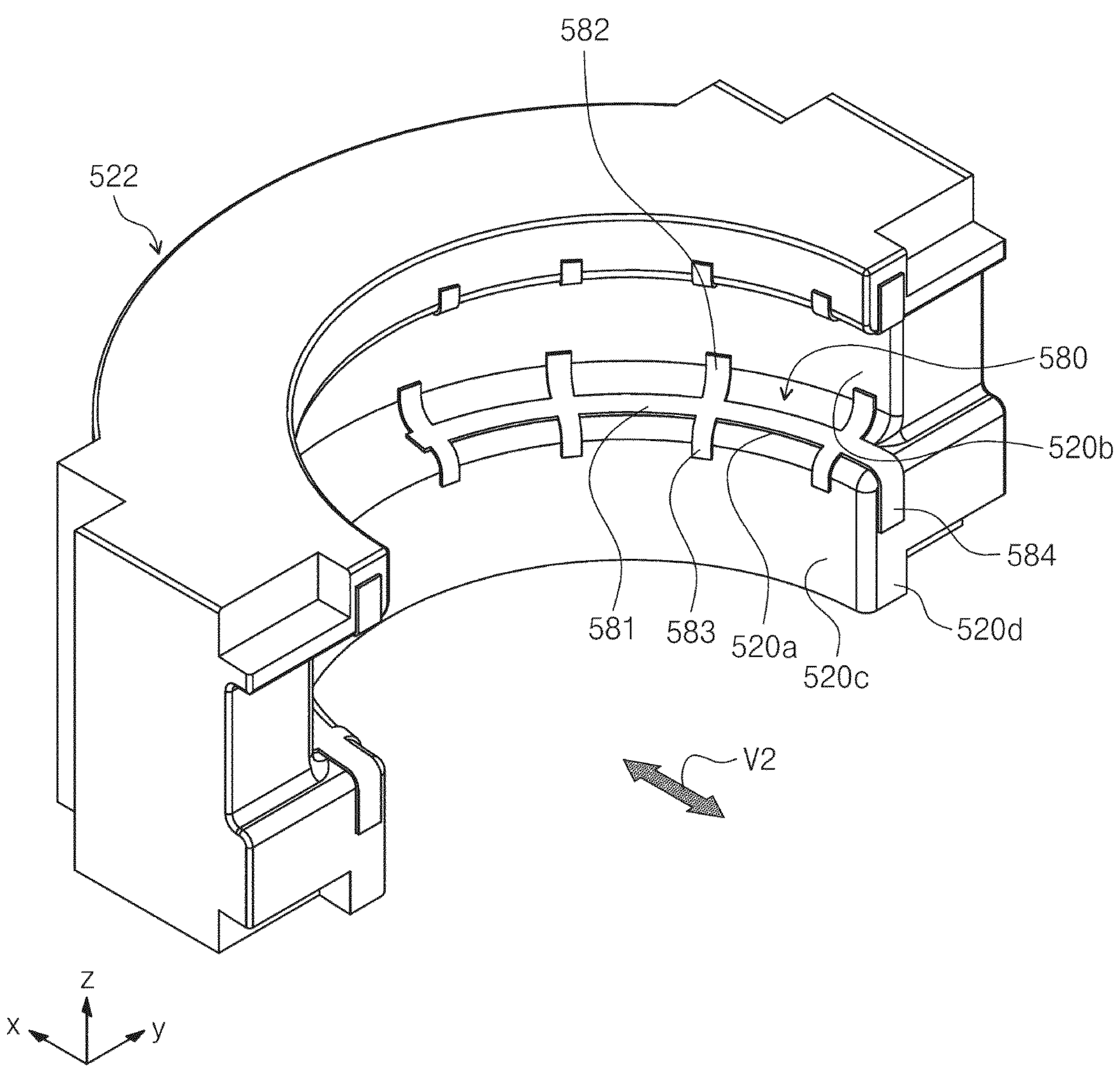

In addition, as illustrated in FIG. 11, a chamber body 510 may transfer a vibration V2 shaking in a front-back direction, for example, the first direction X to the clamping body 520. In this case, even if the vibration V2 shaking in the first direction X is transferred to the anti-friction member 580, it is possible to limit the occurrence of a push phenomenon by the third part 584 and the second part 583.

Figure 12:
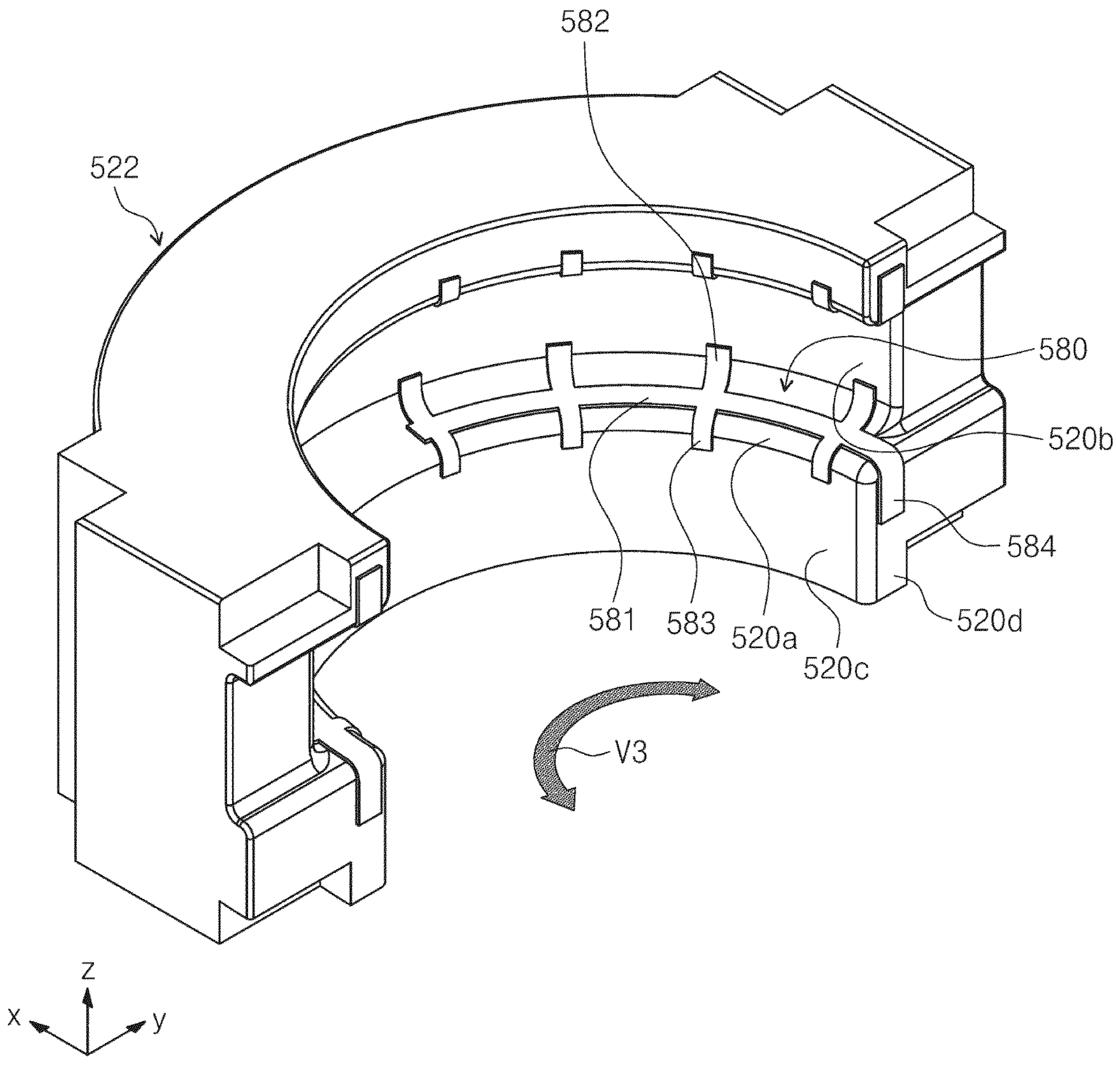

In addition, as illustrated in FIG. 12, a chamber body 510 may transmit a rotational vibration V3 repeatedly rotating in a third direction Z to a clamping body 520. In this case, even if the rotational vibration V3 repeatedly rotating in the third direction Z is transferred to an anti-friction member 580, an occurrence of a push phenomenon by the third part 584 of the anti-friction member 58 may be limited.

The above-described vibrations are merely examples, and in addition to the vibration described above, various types of vibrations may be transferred to the anti-friction member 580. The anti-friction member 580 according to an embodiment of the inventive concept has a supporting force in various directions as the anti-friction member 580 has an inflection point in which the anti-friction member 580 is bent, and thus a deformation phenomenon or a push phenomenon does not easily occur. That is, since the anti-friction member 580 has a planar structure, the deformation phenomenon or the push phenomenon used to be easily generated due to vibration, but the anti-friction member 580 according to an embodiment of the inventive concept has a three-dimensional structure, thereby minimizing the above-described problems.

Figure 13:
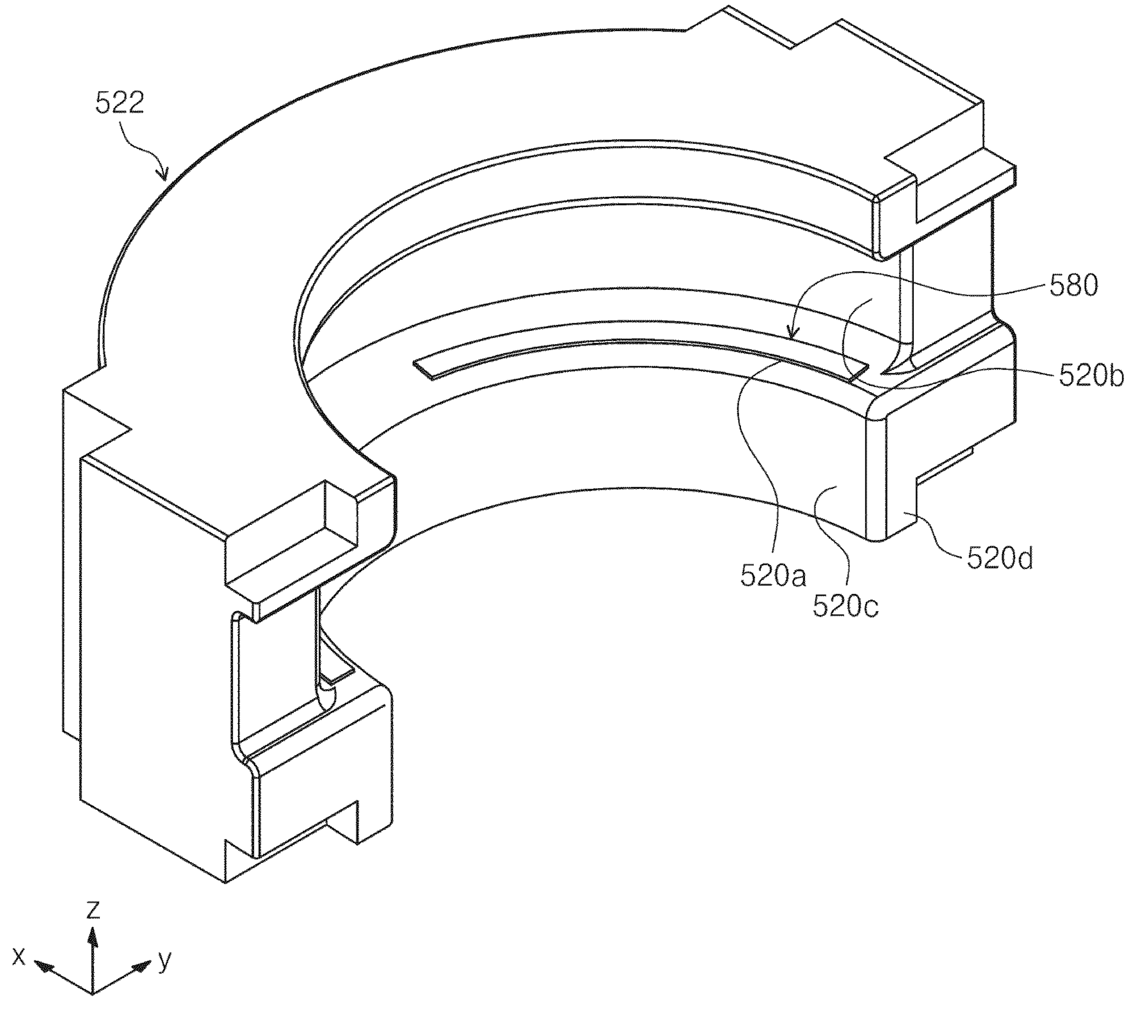
FIG. 13 illustrates an anti-friction member according to another embodiment of the inventive concept.

In the above-described example, the anti-friction member 580 has a first part 581, second parts 582, 583, and a third part 584, but is not limited thereto. For example, as illustrated in FIG. 13, the anti-friction member 580 may be configured to cover only a first surface 520*a*.

Figure 14:
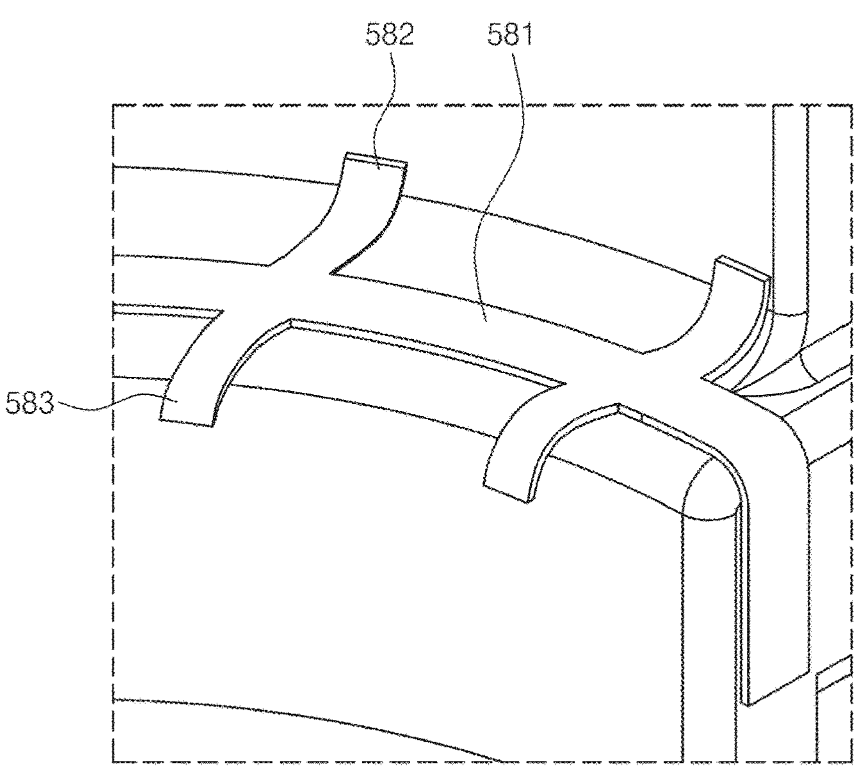
FIG. 14 and FIG. 15 illustrate the anti-friction member according to another embodiment of the inventive concept.
Figure 15:
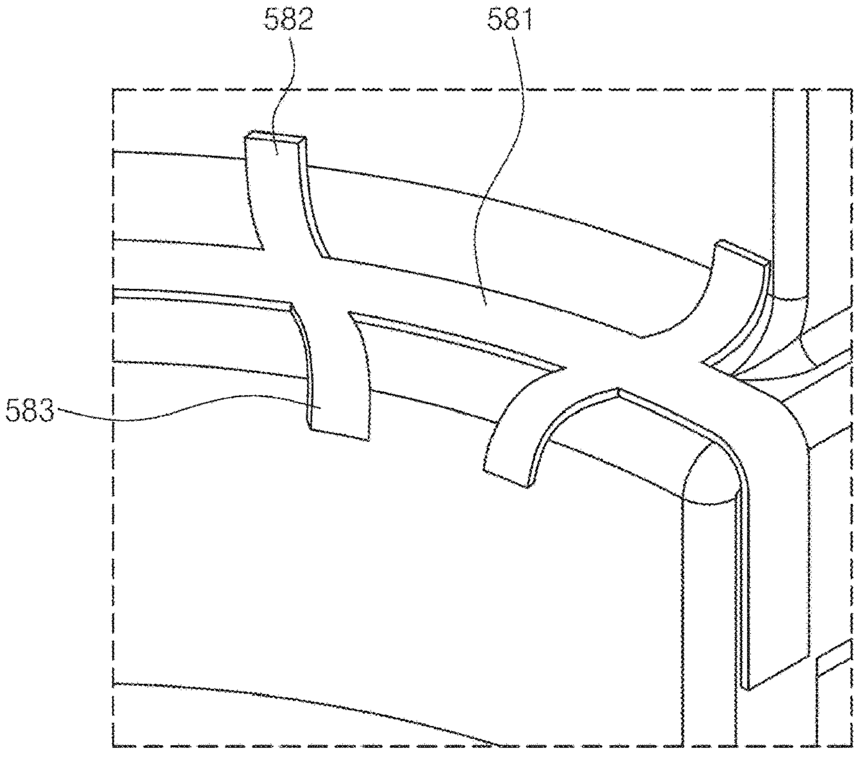

In the aforementioned example, the second part 582 and 583 extends from the first part 581 in an up/down direction, but is not limited to it. For example, as illustrated in FIG. 14 and FIG. 15, the second parts 582 and 583 may extend from the first part 581 in an upward and a downward direction and may extend in an inclined direction.

Figure 16:
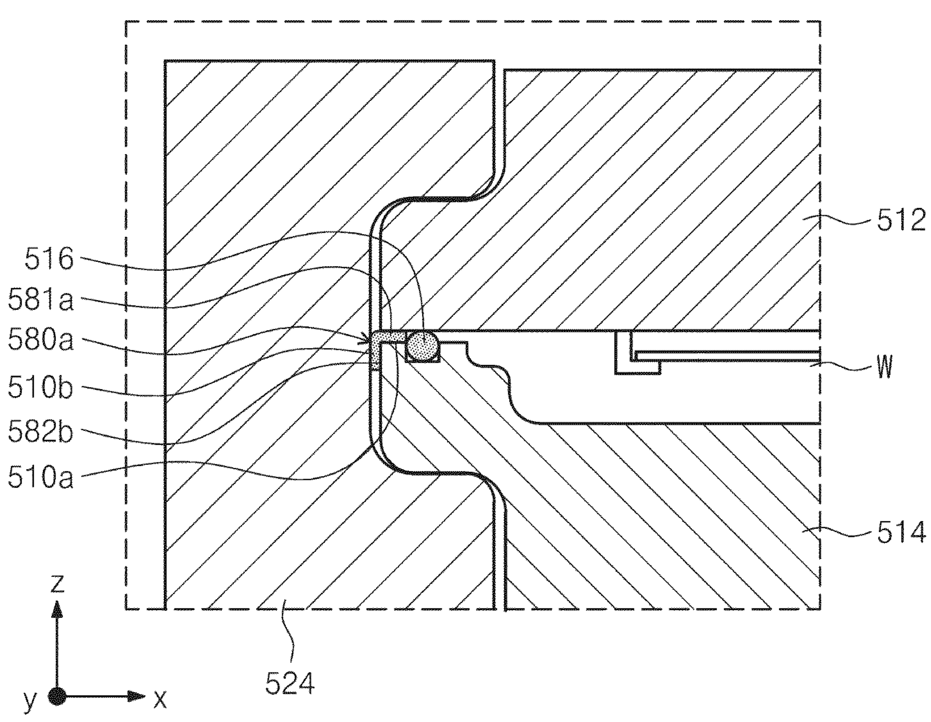
FIG. 16 schematically illustrates another embodiment of the anti-friction member of the inventive concept.

In the above-described example, the anti-friction member 580 is installed on an inner surface of the clamping body 520 as an example, but is not limited to it. For example, as illustrated in FIG. 16, the anti-friction member 580*a* can be installed on a bonding surface of the top body 512 or the bottom body 514. For example, the anti-friction member 580*a* may be installed on a bonding surface of the bottom body 514 and may be configured to continuously cover a first surface 510*a* and a second surface 520*b* of the bottom body 514. For example, the anti-friction member 580*a* may include a first part 581*a* to cover the first surface 510*a* and a second part 582*b* to cover the second surface 510*b*. In addition, the anti-friction member 580*a* may be installed outside a sealing member 516. This is to minimize an inflow of particles generated by the friction of the anti-friction member 580*a* into the treating space 511.

Figure 17:
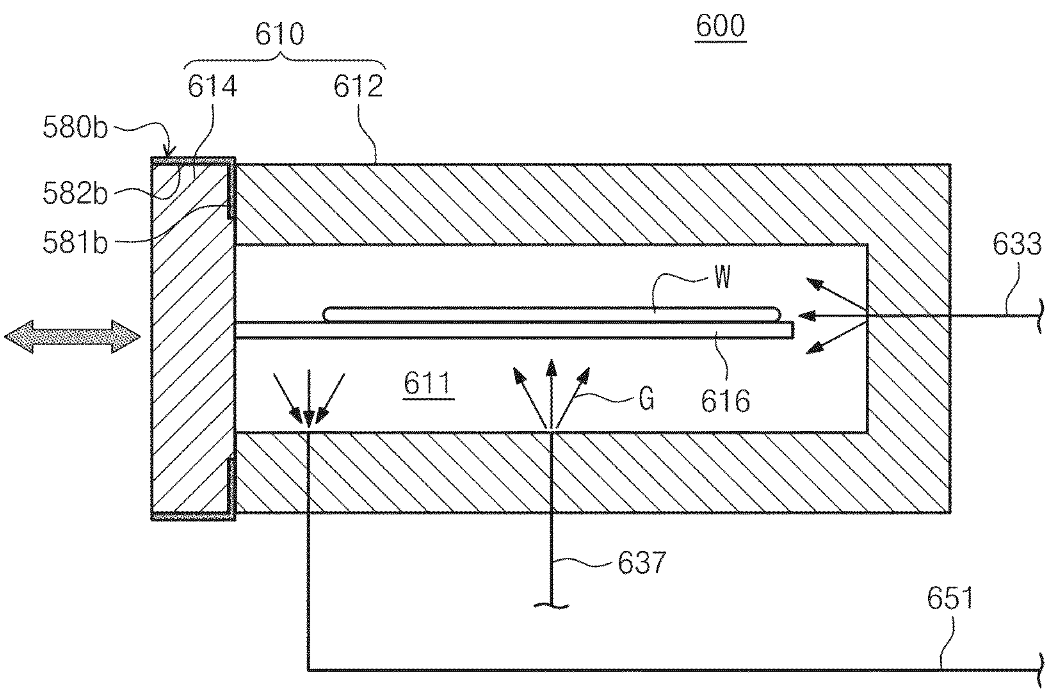
FIG. 17 to FIG. 22 illustrate the drying chamber and anti-friction members according to another embodiment of the inventive concept.

FIG. 17 schematically illustrates a drying chamber according to another embodiment of the inventive concept. The drying chamber 600 for drying the substrate W using a supercritical fluid may include a base body 612 and a door body 614. The base body 612 and the door body 614 may be combined with each other to form a treating space 611. The base body 612 may have a cylindrical shape with an open side, and the door body 614 may be moved in a side direction to selectively open and close the treating space 611. A support shelf 616 supporting the substrate W may be coupled to the door body 614.

A first supply line 633 for supplying a drying fluid G may supply the drying fluid G to a side of the substrate W supported by the support shelf 616. The second supply line 637 for supplying the drying fluid may supply the drying fluid downwardly from the support shelf 616.

An exhaust line 651 for exhausting the drying fluid G may exhaust the treating space 611 in a downward direction.

Figure 18:
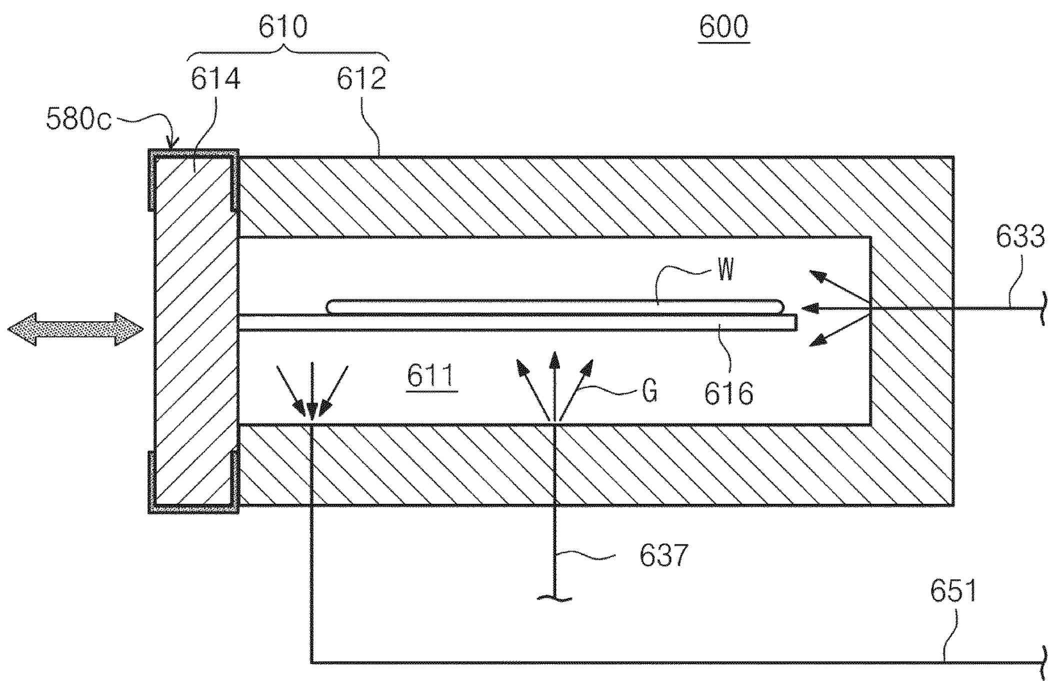

The anti-friction member 580*b* may be attached to the door body 614. The anti-friction member 580*b* may include a first part 581*b* covering a first surface of the door body 614 facing the base body 612, and a second part 582*b* covering a second surface of the door body 614 not parallel to the first surface. When viewed from a cross-section, the anti-friction members 580*b* may generally have an 'L' shape and an inverted 'L' shape. In some cases, as illustrated in FIG. 18, the anti-friction member 580*c* may have a rotated 'U' shape.

Figure 19:
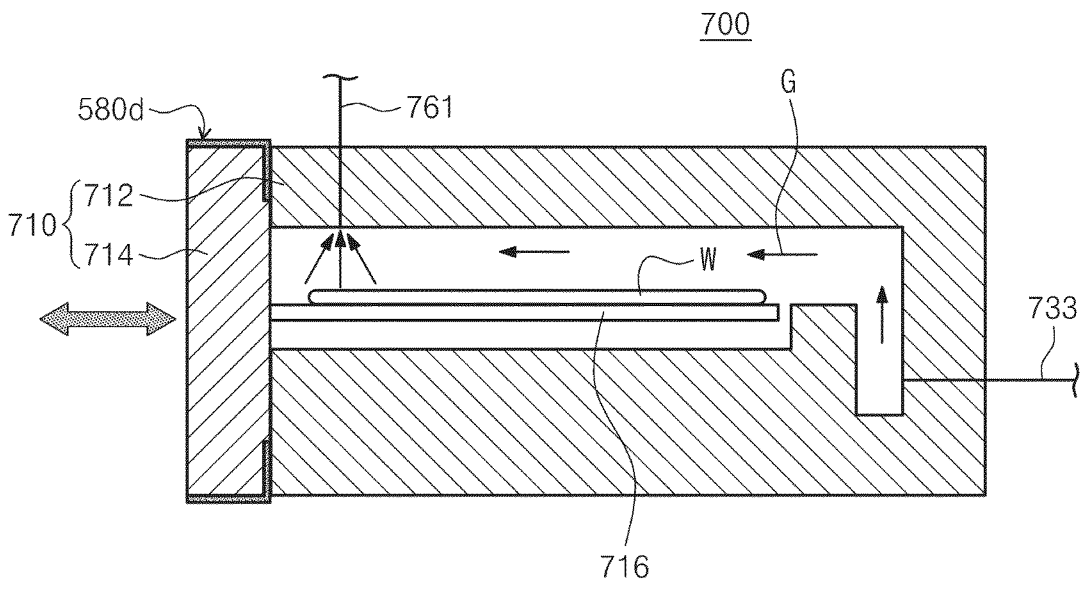

FIG. 19 schematically illustrates a drying chamber according to another embodiment of the inventive concept. The drying chamber 700 for drying the substrate W using a supercritical fluid may include a base body 712 and a door body 714. The base body 712 and the door body 714 may be combined with each other to form a treating space. The base body 712 may have a cylindrical shape with an open side, and the door body 714 may move in a side direction to selectively open and close the treating space. A support shelf 716 supporting the substrate W may be coupled to the door body 714.

A drying fluid G supplied by a supply line 733 may flow along a fluid channel of the drying fluid G formed by the support shelf 716 and the base body 712. The fluid channel of the drying fluid G may be formed to flow along a top surface of the substrate W.

An exhaust line 751 exhausting the drying fluid G may exhaust the treating space 611 in an upward direction.

The anti-friction member 580*d* may be attached to the door body 714. The anti-friction member 580*d* may include a first part covering a first surface of the door body 714 facing the base body 712, and a second part covering a second surface of the door body 714 not parallel to the first surface. When viewed from a cross-section, the anti-friction member 580*d* may generally have an 'L' shape and an inverted 'L' shape.

Figure 20:
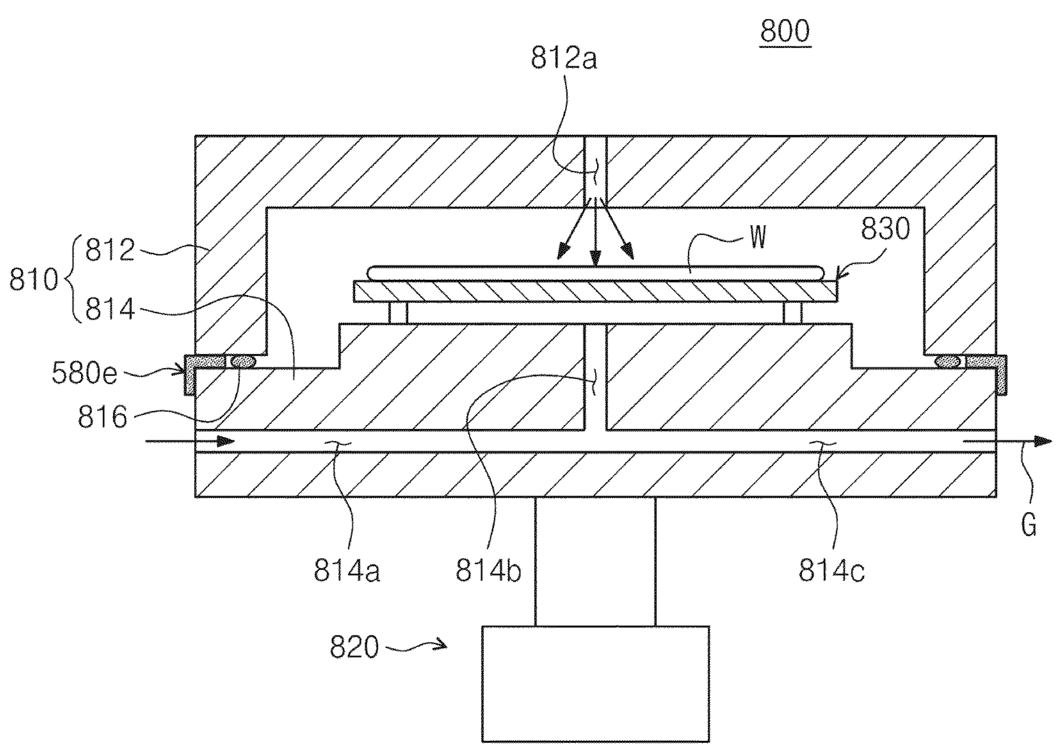

FIG. 20 schematically illustrates a drying chamber according to another embodiment of the inventive concept. The drying chamber 800 for drying a substrate W using a supercritical fluid may include a body 810 and a lifting/lowering member 820. The body 810 may include a top body 812 and a bottom body 814. The top body 812 and the bottom body 814 may be combined with each other to form a treating space in which the substrate W is treated. In addition, the drying chamber 800 may include a support member 830 for supporting the substrate W in the treating space. In addition, the drying chamber 800 may further include a sealing member 816 capable of maintaining an airtightness of the treating space formed by the top body 812 and the bottom body 814.

In addition, a top channel 812*a* for supplying a drying fluid G may be formed at the top body 812. In addition, a bottom channel 814*b* capable of performing both a supply and an exhaust of the drying fluid G may be formed at the bottom body 814. The bottom channel 814*b* may be in fluid communication with a supply channel 814*a* for supplying the drying fluid G and an exhaust channel 814*c* for exhausting the drying fluid G.

An anti-friction member 580*e* may be provided at a bonding surface where the top body 812 and the bottom body 814 are in contact. The anti-friction member 580*e* may be installed at the bottom body 814. The anti-friction member 580*e* may include a first part covering a surface of the top body 812 and the bottom body 814 facing each other, and a second part covering a second surface perpendicular to the first surface. When viewed from a cross-section, the anti-friction member 580*e* may generally have an inverted 'L' shape.

Figure 21:
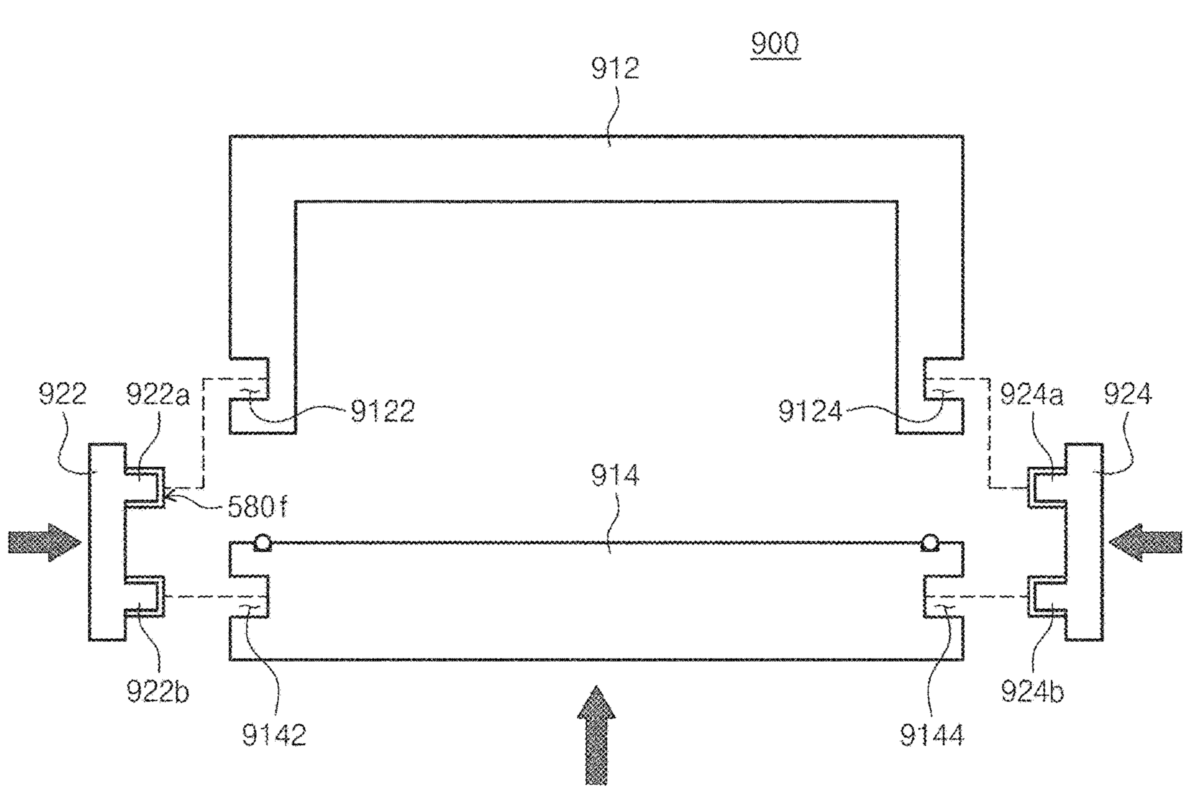

FIG. 21 schematically illustrates a drying chamber according to another embodiment of the inventive concept. The drying chamber 900 for drying a substrate W using a supercritical fluid may include a chamber body 910 and a clamping body 920. The chamber body 910 may include a first chamber body 912 and a second chamber body 914. The second chamber body 914 may be provided to be relatively movable with respect to the first chamber body 912. The two bodies may be combined with each other to form a treating space in which the substrate is treated by a drying fluid. In addition, when the substrate is treated by the drying fluid in a supercritical state, a close position of the first chamber body 912 and the second chamber body 914 may be released by a pressure.

Accordingly, the clamping body 920 may clamp the chamber body 910 while the substrate is treated at the drying chamber 900.

The clamping body 920 may include a first clamping body 922 and a second clamping body 924. The protrusions 922*a* and 922*b* of the first clamping body 922 may be inserted into a groove 9122 formed in the first chamber body 912 and the groove 9142 formed in the second chamber body 914, respectively. In addition, the protrusions 924*a* and 924*b* of the second clamping body 924 may be inserted into the groove 9124 formed in the second chamber body 914 and the groove 9144 formed in the second chamber body 914 respectively.

In addition, an anti-friction member 580*f* may be installed on a bonding surface where the clamping body 920 and the chamber body 910 are bonded. For example, the anti-friction member 580*f* may be configured to cover protrusions 922*a*, 922*b*, 924*a*, and 924*b* of the clamping body 920. In addition, the anti-friction members 580*f* may be configured to cover at least two surfaces of each of the protrusions 922*a*, 922*b*, 924*a*, and 924*b*.

Figure 22:
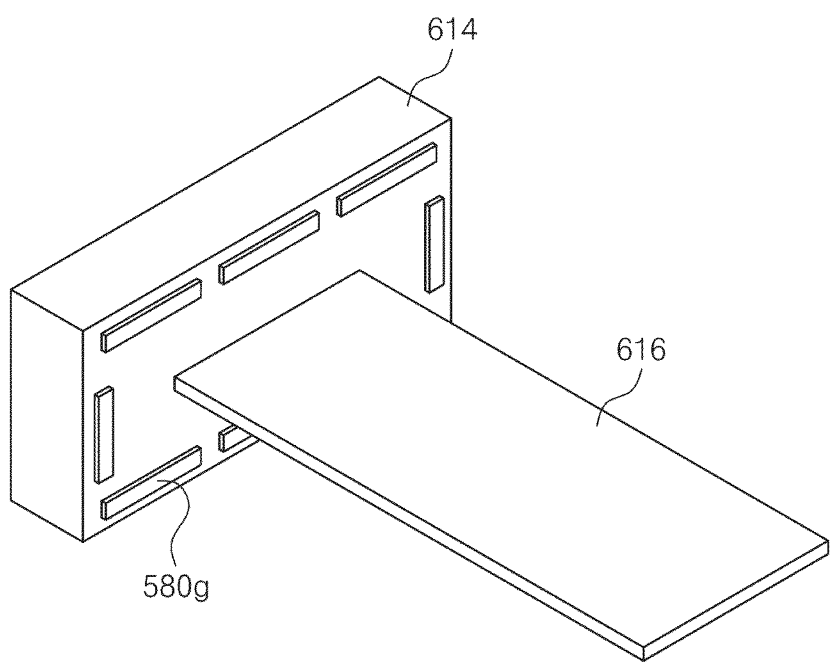

FIG. 22 illustrates another embodiment of an anti-friction member 580*g* that may be installed in a drying chamber 600 shown in FIG. 17. A plurality of anti-friction members 580*g* may be provided. The anti-friction member 580*g* may be installed on a bonding surface where a base body 612 and a door body 614 are bonded to each other. Specifically, the plurality of anti-friction members 580*g* may be installed to be spaced apart from each other on a bonding surface of the door body 614. In addition, as described above, the door body 614 may be provided to be relatively movable by the moving unit with respect to the base body 612. A space between the anti-friction members 580*g* may also be a space allowing any one of the anti-friction members 580*g* to be spaced apart from another adjacent anti-friction member 580*g* when the door body 614 is in a close position which defines a treating space.

The effects of the inventive concept are not limited to the above-mentioned effects, and the unmentioned effects can be clearly understood by those skilled in the art to which the inventive concept pertains from the specification and the accompanying drawings.

Although the preferred embodiment of the inventive concept has been illustrated and described until now, the inventive concept is not limited to the above-described specific embodiment, and it is noted that an ordinary person in the art, to which the inventive concept pertains, may be variously carry out the inventive concept without departing from the essence of the inventive concept claimed in the claims and the modifications should not be construed separately from the technical spirit or prospect of the inventive concept.

What is claimed is:

1. A substrate treating apparatus comprising:
a body;
a fluid supply configured to supply a treating fluid to a treating space within the body; and
a fluid exhaust line configured to exhaust the treating fluid from the treating space,
wherein the body comprises
a first body,
a second body configured to relatively move with respect to the first body, and
an anti-friction film configured to prevent a friction between the first body and the second body, and wherein the anti-friction film is configured to continuously cover at least two surfaces among surfaces of the first body and the second body, wherein the surfaces of the first body and the second body comprise:

a first surface; and a second surface extending from the first surface, wherein the anti-friction film includes a first part configured to cover the first surface, and a plurality of second parts which extend in a cross direction from an extension direction of the first part and are configured to cover the second surface, and wherein a pair of the plurality of second parts that are adjacent to each other along the extension direction of the first part are spaced apart from an adjacent second part by a space of 15 mm to 20 mm.

2. The substrate treating apparatus of claim 1, wherein the plurality of second parts includes a first group of the plurality of second parts extending from the first part in an upward direction, and a second group of the plurality of second parts extending in a downward direction.

3. The substrate treating apparatus of claim 2, wherein the plurality of second parts included in the first group extend from the first part in an upward and inclined direction, and the plurality of second parts included in the second group extend in a downward and inclined direction.

4. The substrate treating apparatus of claim 1, wherein the anti-friction film has a form in which the first part and the plurality of second parts are integrally formed.

5. The substrate treating apparatus of claim 1, wherein surfaces of the first body and the second body include a third surface extending from the first surface and the second surface, and the anti-friction film further includes a third part extending from the first part.

6. The substrate treating apparatus of claim 1, wherein the first body is a chamber body defining the treating space, and the second body is a clamping body for clamping the chamber body.

7. The substrate treating apparatus of claim 1, wherein each of the first body and the second body is a first chamber body and a second chamber body that combine with each other to define the treating space.

8. The substrate treating apparatus of claim 7, wherein any one of the first body or the second body is movable in a side direction.

9. The substrate treating apparatus of claim 7, wherein any one of the first body or the second body is movable in an up/down direction.

10. A substrate treating apparatus comprising:

a chamber body defining a treating space for treating a substrate, the chamber body including a first chamber body and a second chamber body configured to relatively move with respect to the first chamber body;

a clamping body configured to clamp the first chamber body and the second chamber body, if the first chamber body and the second chamber body are in close contact in a close position; and an anti-friction film attached to the clamping body and configured to prevent a friction between the clamping body and the chamber body, wherein the anti-friction film is a polyimide film.

11. The substrate treating apparatus of claim 10, wherein the anti-friction film is configured to continuously cover at least two surfaces among surfaces of any one of the clamping body or the chamber body.

12. The substrate treating apparatus of claim 11, wherein the anti-friction film is provided in a plurality and spaced apart from each other.

13. The substrate treating apparatus of claim 12, wherein some anti-friction films are arranged in a circumferential direction and spaced apart when seen from above.

14. The substrate treating apparatus of claim 13, wherein the surfaces of any one of the clamping body or the chamber body comprise:

a first surface;

a second surface extending from the first surface; and a third surface extending from the first surface and the second surface, and wherein the anti-friction film includes a first part configured to cover the first surface, a second part which extends in a cross direction from an extension direction of the first part and is configured to cover the second surface, and a third part extending from the first part.

15. A substrate treating apparatus for treating a substrate by using a treating fluid in a supercritical state, the substrate treating apparatus comprising:

a body;

a fluid supply configured to supply the treating fluid to a treating space within the body; and a fluid exhaust line configured to exhaust the treating fluid from the treating space, and wherein the body comprises a chamber body defining the treating space for treating the substrate, the chamber body including a first chamber body and a second chamber body configured to relatively move with respect to the first chamber body, a clamping body configured to clamp the first chamber body and the second chamber body, if the first chamber body and the second chamber body are in close contact in a close position, the clamping body including a first clamping body and a second clamping body, and an anti-friction film configured to prevent a friction between the clamping body and the chamber body, wherein the anti-friction film is installed at the clamping body and is configured to continuously cover at least two surfaces among surfaces of the clamping body, and wherein the anti-friction film is a polyimide film.

16. The substrate treating apparatus of claim 15, wherein the surfaces of the clamping body comprise:

a first surface parallel to a ground;

a second surface extending crosswise with respect to the first surface; and a third surface extending crosswise with respect to the first surface and the second surface, the third surface being a surface in which the first clamping body and the second clamping body face each other, and wherein the anti-friction film comprises a first part configured to cover the first surface, a second part extending from the first part and configured to cover the second surface, and a third part extending from the first part and configured to cover the third surface.

* * * * *